United States Patent
Jellus

(10) Patent No.: US 7,888,936 B2
(45) Date of Patent: Feb. 15, 2011

(54) PHASE CORRECTION METHOD

(75) Inventor: Vladimir Jellus, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/763,480

(22) Filed: Apr. 20, 2010

(65) Prior Publication Data

US 2010/0201364 A1    Aug. 12, 2010

Related U.S. Application Data

(63) Continuation of application No. 11/933,499, filed on Nov. 1, 2007, now abandoned.

(60) Provisional application No. 60/856,431, filed on Nov. 2, 2006.

(51) Int. Cl.
*G01V 3/00* (2006.01)

(52) U.S. Cl. ...................... 324/309; 324/307

(58) Field of Classification Search .......... 324/309, 324/307, 306

See application file for complete search history.

(56) References Cited

U.S. PATENT DOCUMENTS

| | | | |
|---|---|---|---|
| 5,226,418 | A | 7/1993 | Bernstein et al. |
| 6,016,057 | A | 1/2000 | Ma |
| 6,617,850 | B2 | 9/2003 | Welch et al. |
| 7,102,352 | B2 | 9/2006 | Hinks et al. |
| 7,227,359 | B2 | 6/2007 | Ma |
| 7,420,370 | B2 * | 9/2008 | Hinks et al. .................. 324/309 |
| 7,515,742 | B2 * | 4/2009 | Zhao et al. .................. 382/128 |

OTHER PUBLICATIONS

"Multislice and Multicoil Phase-Sensitive Inversion-Recovery Imaging," Ma, Magnetic Resonance In Medicine, vol. 53 (2005) pp. 904-910.
"Phase Correction In Two-Point Dixon Water and Fat Imaging Using a Three-Dimensional Region-Growing Algorithm," Ma, 12th Annual Scientific Meeting of the International Society of Magnetic Resonance in Medicine (2004).
"Fat-Suppressed Three-Dimensional Dual Echo Dixon Technique for Contrast Agent Enhanced MRI," Ma et al, Journal of Magnetic Resonance Imaging, vol. 23 (2006), pp. 36-41.
"A Fast Spin Echo Two-Point Dixon Technique and its Combination with Sensitivity Encoding for Efficient T2-weighted Imaging," Ma et al, Magnetic Resonance Imaging (2005).
"Breath-Hold Water and Fat Imaging Using a Dual-Echo Two-Point Dixon Technique With an Efficient and Robust Phase-Correction Algorithm," Ma, Magnetic Resonance in Medicine, vol. 52 (2004) pp. 415-419.

* cited by examiner

*Primary Examiner*—Louis M Arana
(74) *Attorney, Agent, or Firm*—Schiff Hardin LLP

(57) ABSTRACT

A method corrects for a phase error in an MR image, in which MR signals of an examination subject are acquired, complex images of the examination subject are generated, phase differences of the phase values for various image points of the complex images are established with an averaged phase value of image points from a first surrounding region of a respective image point, and a phase correction is executed dependent on how well the phase differences correspond to a predetermined phase value, where the order of the image points in which the phase correction is implemented is dependent on how well the phase values in the image points correspond to the predetermined phase value.

24 Claims, 19 Drawing Sheets

FIG 3
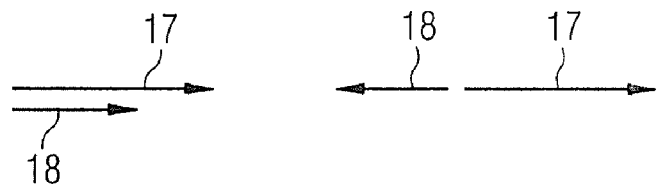
FIG 4
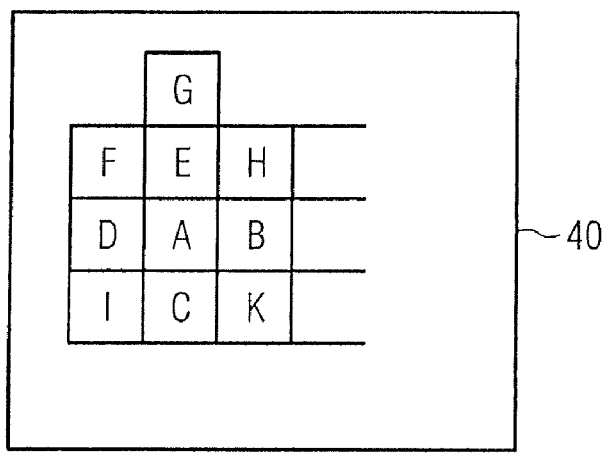
FIG 5
| | |
|---|---|
| Δϕ = 0°-10° | ~51 |
| Δϕ = 11°-20° | |
| Δϕ = 21°-30° | ~51 |
| ⋮ | |
| 81°-90° | |

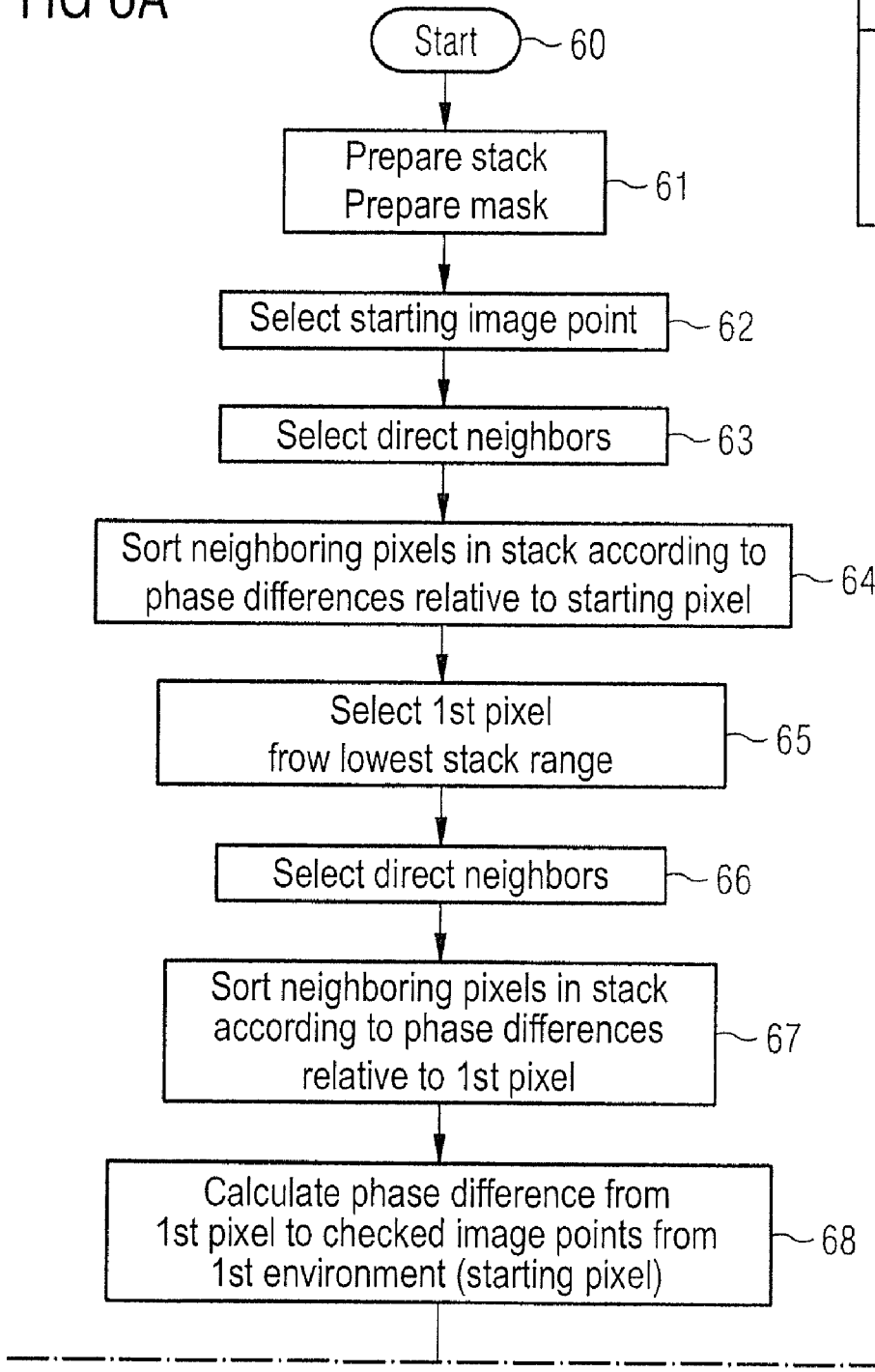
FIG 6A

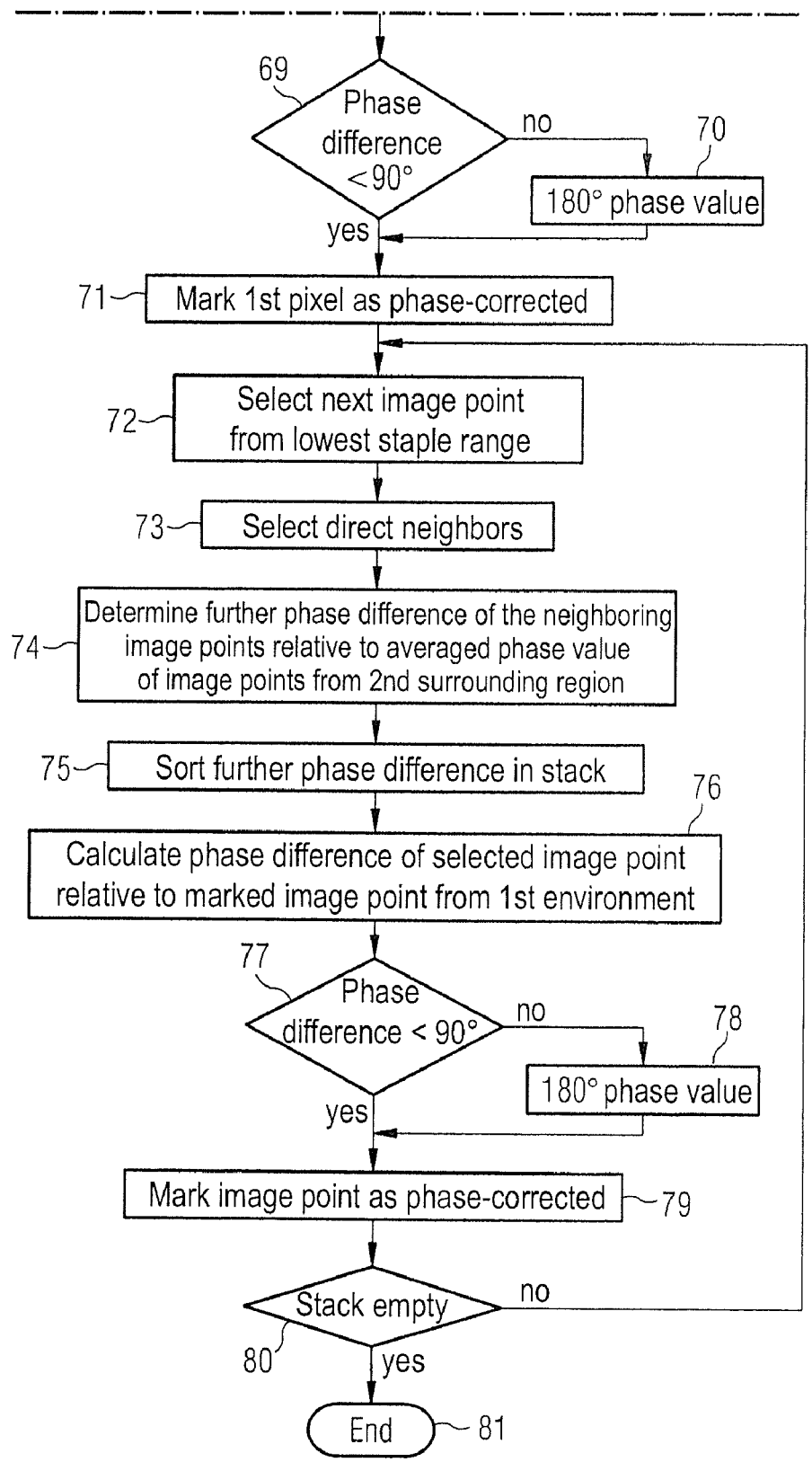

PHASE CORRECTION METHOD

CROSS REFERENCE TO RELATED APPLICATIONS

The present application claims the benefit of U.S. Provisional Application No. 60/856,431, filed Nov. 2, 2006, herein incorporated by reference. Moreover, the present application is a continuation of U.S. application Ser. No. 11/933,499, filed Nov. 1, 2007 and abandoned as of Apr. 26, 2010.

BACKGROUND

The invention concerns a method for correction of a phase error in an MR image. The invention can, for example, be used to calculate the phase error that arises during the imaging due to system instabilities or system imprecisions. Furthermore, the invention can be used for splitting of signals from fatty tissues from signals from aqueous tissues.

Imaging by way of nuclear magnetic resonance, i.e., magnetic resonance tomography ("MR tomography") finds an ever wider field of application in diagnostics. In addition to the innocuousness of the radiated fields and in addition to the fact that the image plane can be freely selected in MR tomography, an MR signal has the advantage that the MR signal can be represented by complex numbers and not just a scalar quantity as is, for example, the case given conventional x-ray images or in computer tomography.

In an MR image, the magnitude of the MR signal and the phase (i.e., the direction of the magnetization vector that corresponds to the signal) exist for each image point. Given standard magnitude imaging, the phase information is not used. However, there are also applications for which the phase information is of greater importance. For example, the phase information is used in order to acquire information about the blood flow. The phase information can, for example, also be used to depict the vessel structure or for temperature imaging.

Given use of the phase information, in many applications, the fundamental problem exists that not only does the desired phase curve exist resulting from the radiated radio-frequency pulses (RF pulses), but also includes other phase effects due to field inhomogeneities or a temporal change of the external magnetic field BO.

However, for many applications it is desirable to be able to quantify the system-dependent phase errors in order to be able to subsequently remove them when using the phase information in the MR image.

One possible application field of phase-corrected MR images lies, for example, in the splitting of the signals from two different tissue components when the examined tissue comprises two different components (e.g., fat and water). Given two different tissues with a different chemical-related shift, a different magnetic field results at the nucleus which leads to different resonance frequencies. In the signal acquisition, this leads to different phase angles of the two components. The most prominent representatives of two different tissue types in the magnetic resonance signal are fat and water, although other applications are also possible. The resonance frequencies of fat and water differ by approximately 3.5 ppm (parts per million). In many clinical MR applications, it is desirable to suppress the signal of the fat since the fat signal is typically very strong and, for example, can occlude lesions.

A further application field of phase-corrected MR images exists given pulse sequences with a previously inserted 180° inversion pulse, i.e., what are known as inversion recovery acquisitions, or given other acquisitions in which a phase change of 180° can exist.

U.S. Patent Publication No. 2005/0165296 A1 describes a phase correction method that is based on what is known as the region growing algorithm, with which the system-dependent phase error is calculated in that phase gradients within the MR image are calculated and this phase gradient is used for a correction algorithm in order to remove system-dependent phase errors. However, two further phase images must be calculated for this correction algorithm: a phase gradient image in the one direction of the image plane as well as a phase gradient in the second direction of the image plane, which makes the calculation complicated.

SUMMARY

The present invention provides a method for phase correction of phase errors that is very effective.

This object is achieved via a method for correcting a phase error in an MR image, comprising: acquiring MR signals of an examination subject; generating complex images of the examination subject from the acquired MR signals; establishing phase differences of phase values for various image points of the complex images with, respectively, an averaged phase value of image points from a first surrounding region of a respective image point; executing a phase correction dependent on how well the phase differences correspond to a predetermined phase value, an order of the image points in which the phase correction is implemented depends on how well the phase values in the image points correspond to the predetermined phase value; and providing a user readable or machine readable output related to the phase correction.

According to various embodiments of the present invention, a method is provided for correction of a phase error in an MR image, this method comprising the following steps: in one step of the method, MR signals of an examination subject are acquired and complex images are generated with the phase information of the examination subject. In the phase correction method, phase differences of the phase values for various image points of the complex images are now calculated with a respective averaged phase value of image points that originate from a first surrounding region of a respective image point.

The calculation of the averaged phase value of the MR signal can proceed as follows. Since the MR signal is a complex quantity with real portion and imaginary portion, the sum of the signals of the adjacent image points can be calculated in order to calculate the averaged phase value, whereby the complex numbers are added in the summation, which corresponds to a vector addition. The phase of this sum is then compared with the phase of the examined image point.

According to a different calculation type, an average value of the sum of the phases can be calculated; in this example, each image point equally contributes to the sum, even when an image point comprises only noise. In the complex summation and the subsequent comparison, the portions of the individual images points are averaged dependent on the signal intensity since image points with low signal also contribute only slightly to the sum given complex addition. Also, no average value calculation is necessary because the phase of the sum is equal to the phase of the average value.

According to a further aspect of various embodiments of the invention, the phase correction is implemented dependent on how well the determined phase differences correspond to a predetermined phase value. The order of the phase correction in the image points is established in the implementation of the phase correction in the various image points such that the order depends on how well the phase values in the image points correspond to the predetermined phase value. A reliable and fast-operating method is provided via the establishment of the phase differences of an image point with averaged phase value from a first surrounding region.

A stable, well-functioning method is achieved due to the fact that the order of the image points when the phase correction is implemented depends on how well the phase differences correspond to a predetermined phase value. Given such correction methods in which the image points are corrected bit by bit, and whereby the results of preceding corrections are built upon, the "history" of the correction method is important. Such methods are also known as "region growing algorithms". A reliably-operating scheme for correction of the phase error is achieved when image points that exhibit a small phase error are used first, and the uncertain image points (where it is uncertain whether the phase information is correct) are preserved for a later point in time.

According to one embodiment of the invention, primarily only image points at which the phase correction has been implemented, i.e., at which it was checked how well the phase differences correspond to the predetermined phase value, are taken into account for the calculation of the averaged phase value from the first surrounding region. Via the use of already phase-corrected image points in the averaging of the phase values in the first surrounding region, it is ensured that image points with possibly false phase values are not taken into account for calculation.

The phase correction can, for example, be an examination as to whether formed phase difference of the image points lies in a predetermined angular range with the averaged phase value from the first surrounding region. If this is the case, the phase value is left unchanged. If the phase difference does not lie in the predetermined angle range, for example, the phase value of the examined image point can be corrected by a predetermined phase value, meaning that the phase correction is implemented. In one exemplary embodiment, the phase correction means that 180° is subtracted from the phase value. As is explained in more detail below, the correction of the phase value with 180° addresses the fact that this phase value possibly concerns a different tissue with a different phase value (such as, for example, fat). If 180° is subtracted from the phase value, it is taken into account that it is a different tissue (such as, for example, fat). The remaining phase value then reflects, for example, the system-dependent phase homogeneity that can subsequently be used in order to identify the phase errors and remove these phase errors in the further phase imaging.

The order of the establishment of the phase difference for the various image points advantageously ensues dependent on how well the phase differences of the individual image points correspond to the neighboring image points of predetermined phase values; the better that the phase difference of an image point corresponds to the adjacent image points from a second environment of the predetermined phase value, the more likely that the corresponding image point with the phase value is taken into account in the phase correction. The image points given which the phase difference of 0° or 180° can be reliably identified are used and accounted for first. When it is subsequently assumed that the phase error varies only slowly and not abruptly across the MR image, i.e., across the various image points, this fact can be taken into account for phase correction.

In a preferred embodiment, it is examined whether the phase difference corresponds not to one but rather to two predetermined phase values, namely 0° and 180°. In this application case it, is checked whether the determined phase differences correspond to 0° or 180°. The better that the phase difference corresponds to 0° or, respectively, 180°, the more likely that the image point is taken into account in the phase correction. Given the check of whether the phase difference of the image point lies in a predetermined angular range relative to the image points from the first surrounding region, in one embodiment it can be examined whether the phase difference lies between 0° and 90° or between 90° and 180°. For example, if the angle lies between 0° and 90°, it can be assumed that the ideal phase (i.e., of the predetermined phase value) lies at 0°. If the calculated phase difference of the phase values with the average value of the phases from the first surrounding region lies in a range of greater than 90°, it can be concluded that the ideal, predetermined phase value is 180°. In this case 180° is subtracted from the phase value of the examined image point.

Such a correction by 180° in particular occurs in the two-point Dixon technique. In this two-point Dixon technique, MR exposures are created in which an echo signal is generated once given a sample of two tissues (such as water and fat), in which both components (fat and water) have the same phase position, and the signal adds both components. Furthermore, a different echo point in time is selected at which the phase position of the one tissue (such as water) is opposite the phase position of the of the other tissue (such as fat).

The phase position for the image point at opposite phase position (what is known as an "opposed phase image") now depends on which components most strongly contribute to the signal. If a phase position in proximity to 180° is now detected and not a phase of 0° (as is the case of identically-positioned phase), it can be assumed that (for example) the fat is the dominating tissue portion. With a method so described, it can now be determined at which image points fat is responsible for the phase position and at which image points water is responsible. If fat is responsible for the phase position, the phase position is inverted by 180° in order to obtain the corresponding phase position of the water; or, expressed otherwise, in order to deduct the influence of the phase due to the fat signal. Which tissue type is present in which image point can thus be identified.

The formed phase difference can be corrected by 180° or not dependent on this knowledge of the tissue type. After this correction of the phase change induced by the fatty tissue, a phase curve in the phase values of the complex MR signal now remains that corresponds to the system-dependent phase errors of the MR system that arise in the time that lies between the signal acquisition of the signals at which the phase position of both tissue's are parallel to one another and the point in time of the signal acquisition at which the phase position of the two tissues was opposite.

According to a further aspect of the invention, in the correction method, the neighboring image points are determined relative to the image points of which the phase difference should be formed. For the neighboring image points, a further phase difference of the respective neighboring image points is then determined relative to averaged phase values of image points from a second surrounding region of the neighboring image points; already-corrected image points are likewise used for the averaged phase values from the second environment. The further phase differences of the neighboring image points are subsequently sorted according to magnitude, and the next image points for which the phase correction is implemented is selected from the neighboring image points, whereby the selection ensues dependent on the further phase difference.

The further phase differences of the neighboring image points are advantageously sorted in the stack ranges. In these stack ranges, the image points with their phase values are organized with predetermined phase ranges. Stack ranges with smaller phase ranges, i.e., phase values with a smaller angular range, are hereby processed before stack ranges with larger phase ranges.

In the individual stack ranges, an image point can be processed according to a FIFO (First In First Out) principle, meaning that the image points in a stack range are processed not according to their magnitude, but rather dependent on their input into the stack range. The stack ranges in total are processed according to magnitude, meaning that stack ranges with small phase values are processed before stack ranges with large phase values.

According to a further aspect of the invention, phase values of adjacent image points from three different spatial directions can be used for the averaging. In the method that was used in the previously described U.S. Patent Publication No. 2005/0165295 A1, only phase gradients in the image plane are used. Points in the third spatial direction are not used.

For the averaging of the phase values in each spatial direction, between three and nine image points are used that are adjacent to the image point for which the phase difference should be calculated relative to the neighboring image points. For example, image points from a 5×5 (2D case) or 5×5×5 (3D case) environment or a 7×7 or, respectively, 7×7×7 environment can be used for the sorting of the image points in the stack, whereby only checked image points from this environment are taken into account. An averaged phase value is necessary, on the one hand, for the difference establishment relative to the individual image points of the MR image (the phase value from the first surrounding region) and an averaged phase value of the neighboring image points relative to their neighboring image points, i.e., from a second surrounding region is in turn necessary.

This second averaged phase value serves to arrange the neighboring image points of the image point for which the phase correction should be implemented dependent on the phase differences in the stack. For example, 7×7×7 image points can be used in the first averaging while 5×5×5 image points, for example, can be used in the second averaging for sorting of the neighboring image points in the stack. Naturally, equally many image points can be used for both averagings, or more image points can be used for the second averaging than for the first averaging.

For the acquisition of the MR signals, in a further application case, it is possible that a plurality of acquisition coils are used in order to acquire the MR signals for image reconstruction. These different complex MR signals from various channels can advantageously be combined into a complex total signal first before the phase correction is conducted on the complex total signal. This has a number of advantages. A first advantage is that the complex total signal has a much better signal-to-noise ratio than the individual MR signals from the different coils. The correction of the phase error method is more robust due to the increased signal-to-noise ratio since fewer phase errors are induced by the noise.

A further advantage exists in that the phase correction method need only be implemented on a single image. For example, if twelve different coils are used for signal acquisition, the phase defects must be corrected for twelve different complex MR images. Procedurally, this is a very elaborate method. The calculation and phase correction are significantly accelerated via the use of a single complex total signal.

To form a complex total signal, it can be advantageous to determine the sensitivity and phase information of each acquisition coil and to take these into account in the qualification of the complex total signal. Each coil can have an influence on the phase value in the MR signal. When this information is taken into account before the addition to a complex total image, the complex total image no longer comprises coil-induced phase information.

Furthermore, to form the complex total signal, it is desirable to estimate the sensitivity of each coil, where the proportion of each coil in the total signal is weighted dependent on the sensitivity of each coil. For example, given signal acquisitions, this has the advantage that coils that have a very poor signal-to-noise ratio for an examination region contribute less to the total signal than coils that have a much better signal-to-noise ratio for this region. Via weighting of the individual coils, the coils whose detected signal is better than the signal of other coils whose proportion relative to the total signal is less contribute more to the total signal.

In the method according to U.S. Patent Publication No. 2005/0165296 A1, the individual images were compared given use of a plurality of coils. When the plurality of the individual images (for example, for an image point) have phase values that allow it to be concluded that these relate to an aqueous tissue while a lower number of images support the presence of fatty tissue at this image point, via a majority decision, it can be determined which tissue is probably present at the image point. However, this calculation is very computation- and time-intensive and complicated. The signal-to-noise ratio is improved via the formation of a complex total signal that is subsequently used for the phase correction, which improves the correction method, and furthermore the number of the data to be processed is significantly reduced.

DESCRIPTION OF THE DRAWINGS

The various embodiments of the invention are subsequently explained in detail with reference to the accompanying drawings.

FIG. 3 is a schematic diagram illustrating the magnetization of two different tissue types at two different echo points in time;

FIG. 4 is a pictorial illustration of a section from an image using which the phase correction method is explained;

FIG. 5 is a pictorial illustration of a stack with a plurality of stack ranges in which the image points are organized dependent on the phase difference;

FIGS. 6A, B is a flow chart of a phase correction method according to an embodiment of the invention;

DETAILED DESCRIPTION OF THE PREFERRED EMBODIMENTS

Figure 1:
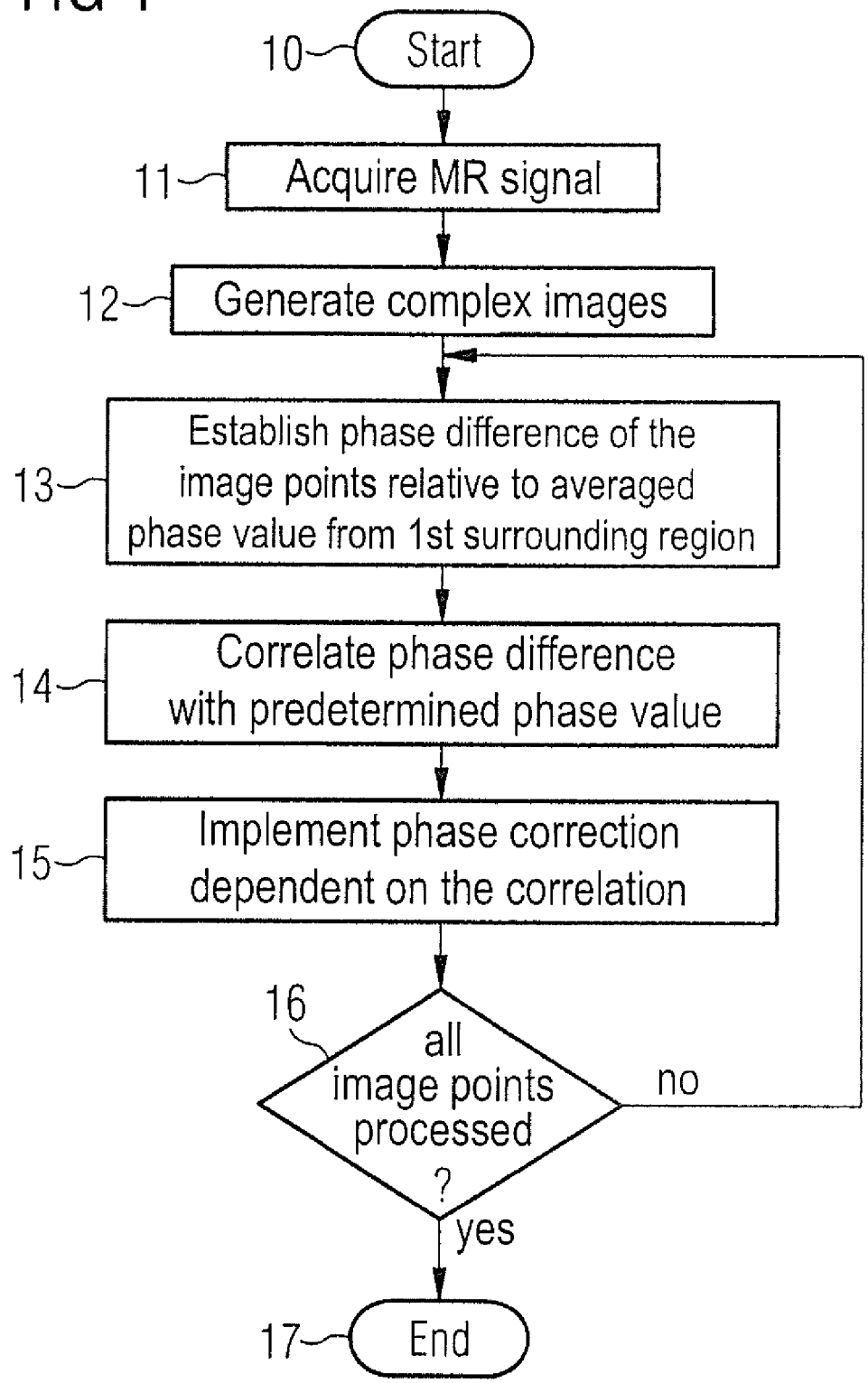
FIG. 1 is a flow chart of a phase correction method according to an embodiment of the invention.

Schematically presented in FIG. 1 is a flow chart which shows the steps that can be used for an embodiment of the inventive phase correction method. After the start of the method in step 10, the MR signals are acquired by one or more acquisition coils in step 11, where complex MR images with phase information are generated in step 12.

In a further step 13 of the method, a phase difference of the image points relative to an averaged phase value from a first surrounding region is calculated. In step 14, it is then checked whether the calculated phase difference coincides with a pre-determined phase value or, respectively, two predetermined phase values. Dependent on the coincidence, a phase correction is implemented or not implemented in step 15, and in step 16 it is checked whether all image points are processed. In the event they are, the method ends in step 17; in the event they are not, the process returns to step 13.

It is subsequently explained in which context the method from FIG. 1 can be employed. If an MR signal is acquired from a tissue with two tissue components, such as fat and water, both tissue components have a different resonance frequency. When two echoes (such as, for example, gradient echoes) are now acquired, these two echoes can be selected via the selection of the echo time such that the phase position of the water coincides once with the phase position of the fat, while in the second echo, the phase position of the water is aligned opposite to the phase position of the fat. After the signal processing and Fourier transformation, two images result: an image with coinciding phase position and a further image with opposite phase position (what is known as the in-phase or, respectively, opposed-phase images). The signal in the two images can be written as follows (while disregarding the tissue relaxation):

$$S_0(m,n) = (W+F)e^{i\phi_0} \quad (1)$$

$$S_1(m,n) = (W-F)e^{i(\phi_0-\phi)} \quad (2)$$

The water portion and the fat portion in a given image point are represented by W or, respectively, F, where m or, respectively, n designates the location of the image point along the x-axis and along the y-axis. Ideally the phase is zero at the echo point in time. $\phi_0$ now indicates the phase in the image that results due to field inhomogeneities and due to a static phase error that can occur in the signal and acquisition chain. The phase $\phi$ represents a further phase error due to the field inhomogeneity that results between the in-phase echo and opposed-phase echo.

When the phase errors are now identified and should be removed, in a first step it must be established in which image point the fat signal or, respectively, the water signal is the dominating component since the phase information in each image point depends on this fact. In order to now determine the fat and water content in each image point, the two phases $\phi_0$ and $\phi$ must be eliminated. This can also occur in the following manner:

$$S'_0(m,n) = S_0(m,n)e^{-i\phi_0} = W+F \quad (3)$$

$$S'_1(m,n) = S_1(m,n)e^{i\phi_0} = (W-F)e^{-i\phi} \quad (4)$$

$e^{-i\phi_0}$ can be determined via the ratio of the magnitude of the image S0 over the image itself, with $e^{-i\phi_0}$ $$e^{-i\phi_0} = |S_0(m,n)|/S_0(m,n) \quad (5)$$

However, given magnetic field inhomogeneities, $\phi$ is not zero. As is to be recognized from equation (4), the phase $\phi$ of the magnetic field inhomogeneity depends on whether fat or water is the dominating signal portion in the tissue.

The basis of the phase correction algorithm is subsequently explained in connection with FIG. 3. In FIG. 3, the magnetization of the water 17 and the magnetization of the fat 18 are shown on the left side at an echo point in time at which they have the same phase position. In this case, the two magnetizations are added. When the magnetization of the water 17 is aligned opposite the magnetization of the fat 18 in the right part of FIG. 3.

In the shown example, the magnetization vector of the water is greater than that of the fat, such that the total magnetization perceivable in the image points points in the direction of the water. In what is known as the opposed-phase image format that is shown to the right in FIG. 3, the total phase position that is comprised in the image point now depends on whether the fat portion or the water portion dominates. If the fat portion should dominate, the magnetization 18 of the fat that is aligned counter to the water magnetization would be the greater vector, such that in total, the phase vector is aligned opposite to the example presented to the left in FIG. 3.

In summary, this means that given a fat-dominated image point the phase position in the opposed-phase image should ideally by 180° while it should otherwise be 0°. Since the quantity W−F from equation (4) can now be either positive or negative dependent on whether the fat portion or the water portion is dominant, equation (4) can be rewritten as follows:

$$e^{-i\phi} = \pm S'_1(m,n)/|S'_1(m,n)| \quad (6)$$

If the phases should now be determined based on the phase inhomogeneity in order to taken them into account in the phase determination, it must first be identified in which image points fat or, respectively, water is the dominant portion. In the event that fat is the dominant signal portion, the phase value must be corrected by 180° in order to remove the phase influence of the fat portion from the image. The phase correction method is now based on the identifying the image portions with dominating fat portion, accounting for the phase influence due to the fact and removing it. The phase remaining after this phase correction represents the phase error due to the laterally-variable field inhomogeneity.

Ideally, the phase values thus amount to either 0° or 180° in the opposed-phase image. However, in reality, these phase values fluctuate due to the field inhomogeneity that results between the first echo and the second echo. In what is known as a region growing method, the pixels can now be determined in which probably fat or probably water is the dominating signal portion in order to then subsequently correct the phase by 180° in the event that fat is the dominating signal portion.

When phase values between 10° and 20° occur in an image point, it can be assumed with relatively large assurance that it is a water signal component. Given phase values of 170°-180°, it can likewise be assumed that these are very probably fat signal portions in this image point. Given phase values in proximity to 90°, however, this decision is more difficult. In a subsequent example, it is now assumed that the tissue component is probably water at this image point when phase values of less than 90° are present while the dominating component is probably fat given values greater than 90°. For this examination, the phase value of each image point is compared with an average value of the phase values from the first environment and the phase value is then corrected or not.

Figure 2:
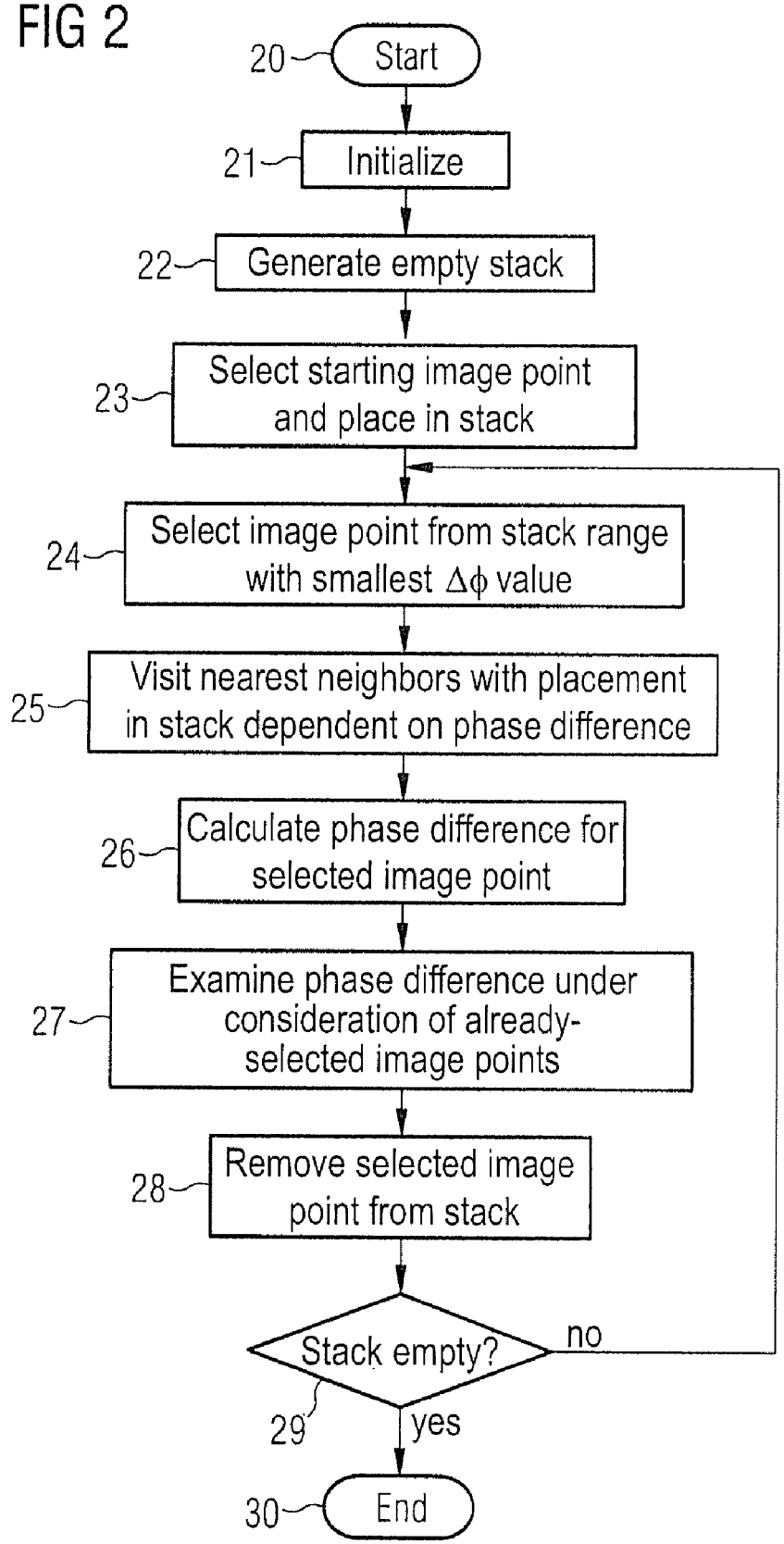
FIG. 2 is a further flow chart with the steps for correction of a phase error according to an embodiment of the invention.

In FIG. 2 illustrates how whether the dominating component in the image point is fat or water can be determined with a phase correction method which operates with effective reliability. The method from FIG. 2 thereby employs the calculation of phase differences of the examined image points relative to an averaged phase value of adjacent image points. Given system-dependent phase inhomogeneities, it can be assumed that the system-dependent phase change changes only slightly or, respectively, slowly from image point to image point over the image.

Only image points for which a phase correction was already implemented are hereby taken into account in the averaging of the phases of the neighboring image points. In order to design the phase correction method in a robust and efficient manner, the image points are processed in an order, and, in fact, such that image points given which the phase values relatively surely suggest a fat or water content are processed first, while image points with less certain phase values are processed at a later point in time.

The method shown in FIG. 2 starts in step 20. In an initial step 21, for example, a marking is set to 0 for all image points of the acquired MR images. In the event that a phase correction was implemented in the image point at a later point in time, this marking is set to 1 in order to indicate that this image point was already processed, and to prevent that this image point is processed again. In step 22, an empty stack is generated as it is shown, for example, in FIG. 5. The individual image points in this stack are organized dependent on phase differences that are explained in detail below.

This stack 50 shown in FIG. 5 comprises a plurality of stack ranges 51. In these stack ranges, the individual image points can be placed dependent on their phase differences. In the shown exemplary embodiment, the stack ranges 51 are dimensioned such that the stack range accommodates phase differences of approximately 10°. In terms of magnitude, the phase differences can assume values between 0° and 90° such that nine stack ranges were used in the shown exemplary embodiment. The stack ranges can also be dimensioned differently.

An arbitrary starting image point from the opposed-phase image is selected in step 23. In step 24, an image point with the smallest $\Delta\phi$ value is subsequently selected from a stack range. This means that the phase differences is with relatively high probability in the area of 0° or, respectively, 180°. In step 25 the nearest neighbors of the selected image point are determined. The neighboring image points are placed in a stack dependent on an averaged phase value of the image points from the neighborhood to the neighboring image points to the selected image point.

In step 26, the phase difference of the originally selected image point is calculated relative to the averaged phase value of the neighboring image point. If this calculated phase difference is smaller than 90°, the phase value is left unchanged; if the calculated phase change is greater than 90°, the phase value is corrected by 180° (step 27). After the phase correction was implemented in step 27, the selected image point is removed from the stack, the examined image point is marked as phase-corrected (step 28). For example, this can mean that the value $\phi$ is set from 0 to 1 in the mask initialized in step 21.

In the present example, a phase correction means the examination of the phase difference, and in the event that the phase difference is smaller than 90° the phase value remains unchanged; given values greater than 90°, the phase is corrected by 180°. Given image points at which the phase correction was implemented, this can mean that the phase was possibly left unchanged. However, in each case the phase difference was examined relative to the neighboring image points.

In step 29, it is now determined whether image points that are not yet examined are contained in the stack. If image points are contained in the stack 50, the method returns to step 25 and the next image point with the smallest phase difference is selected from the stack. In the event that the phase correction was implemented for all image points, the method ends in step 30.

The phase correction method is described in closer detail in connection with FIG. 4-6.

As shown in FIG. 6A, the method starts in step 60. The stack 50 shown in FIG. 5 is prepared in a next step 61. At the beginning of the correction method, no image point has yet been corrected and a starting image point is selected in step 62. This image point is marked as visited and checked. For example, this image point is marked with "C" for "checked" and with "v" for "visited". For this image point, it cannot be established whether it is an image point with water content or fat content.

However, in the present state, this is also not of importance. If it is an image point with fat signals, the water signal portions are phase-corrected in the subsequent correction method. The decision of which tissue portions are fat or water can, however, only be made at the conclusion of the method. For example, as a starting image point, an image point in the middle of the image can be selected, or an image point with the highest magnitude signal, or other requirements for the starting image point can also be posed.

In the section from the MR image 40 shown in FIG. 4, for example, the image point designated with A is the starting image point for the correction method. In a next step 63, the direct neighbors of this image point A are selected. In the shown example these are the image points B, C, D and E. In the event that this is a three-dimensional data set, the adjacent image points in the third spatial direction can be used.

However, in another exemplary embodiment, a plurality of neighbors can also be used, for example, in the two-dimensional case under consideration of the image points F and H, I and K, which would mean eight image points as nearest neighbors in the two-dimensional case or 26 image points in the three-dimensional case. However, in the subsequent example it is assumed that only the four nearest neighbors B, C, D and E were selected.

In the next step 64, the phase difference of each neighboring image point relative to adjacent image points is calculated for each neighboring image point, for example 5×5 image points of this neighbor that were already checked (i.e., have been marked with "C"). The phase differences of the respective neighboring image points relative to the starting image point A are then placed in the stack 50. For example, if the phase difference for the image point E relative to the image point A is 5°, image point R would thus be placed in the uppermost stack range 51. If the phase difference of pixel C relative to pixel A is 24°, pixel C would be placed in the third-uppermost stack range etc. The neighboring image points are thus placed in the stack based on their phase differences. The visited neighbors are marked as visited. The neighbors are organized in stack ranges 51 in the stack shown in FIG. 5. For example, the stack range 51 comprises the phase difference values from 0 to 10°, a second region comprises the phase differences from 11 to 20°, etc.

Every single stack range can hereby operate according to the first-in, first-out principle. In total the stack, ranges are processed according to magnitude, meaning that the stack range 0 to 10° is processed before the stack range 11 to 20°. However, in the stack range itself, processing can ensue according to the first-in, first-out principle, meaning that the image points in a stack range are processed dependent on their input into the stack range.

In the next step 65, the next image point is then selected from the stack, whereby the process begins with the still-full stack range with the lowest phase values. In the phase difference calculation, the phase difference is calculated between the complex values of the neighboring image points and the examined image point. This can lie between −180° and 180°. The absolute value of this is now taken, meaning that the phase difference now lies between 0 and 180°. The stack range with values between 0 and 10° now exhibits phase differences between 0 and 10° and 170 and 180°, the second stack range with values from 11 to 20° comprises these values and values between 160 and 170° etc. Considered otherwise, this means that values between 0 and 180° are present after taking the absolute values.

When the phase difference is smaller than 90°, it remains unchanged; given phase differences greater than 90°, the value is corrected by 180°. The result of this conversion is values between 0 and 90°, whereby the stack ranges can in turn be arranged with stack ranges from 0 to 10°, 11 to 20° etc. based on this result. It is subsequently assumed that this is the image point E. The nearest neighbors that were not yet marked as visited (i.e., here the image points F, G and H) are visited in turn (step 66).

In the next step 67, the neighboring image points are placed in the stack. As in step 64, an averaged phase value of the surrounding pixels is calculated in turn and this averaged phase value is compared with the phase value of the neighboring image point for this placement of the neighboring image points in the stack. Given the calculation of the averaged phase value, again, only image points that have already been checked are taken into account.

After the neighboring image points have been organized in the stack, the phase difference is calculated for the image point (which was selected in step 65) relative to an average value of the phase values of the adjacent image points, whereby again only image points that have already been checked (i.e., have been marked with "C") are taken into account in the calculation. With regard to the image point selected in step 65, for example, these neighboring image points can be selected from a region of 7×7 or 7×7×7 image points around the selected image point. Since only already-checked image points are used, this is the starting image point A in the present example.

This means that the phase difference between the image points A and E is calculated in step 68. In step 69, it is hereby checked whether the calculated phase difference is smaller than 90°. If this is the case, the phase value is left unchanged for image point E. When the phase difference of E relative to the examined neighbors (i.e., image point A) is greater than 90°, the calculated phase value of E is corrected by 180° (step 70) since, in this case, it is assumed that in this image point the fat signal is the dominating tissue. Via this correction the phase, influence due to the fat is accounted for and removed.

In step 71, this pixel E is then marked as checked, meaning marked with "C" in the prior example and removed from the stack. In step 72 the next image point from the stack 50 that lies in the lowest stack range is subsequently selected. In step 73, the neighboring image points that were not yet marked as visited are again selected and visited as in step 66. In step 74, a further phase difference is determined for each neighboring image point relative to the averaged phase value of image points from a second surrounding region.

This means that the method does not proceed as at the beginning, since no neighboring image points have yet been checked; the phase difference between selected image points and the neighboring image points has not yet been calculated. Rather, the phase difference of the neighboring image points and the sum of the image points are determined in a second surrounding region. Again only already-checked image points are hereby taken into account. In the present case, these are two image points, namely the starting image point A and the image point E that was checked subsequently and that are taken into account for the averaging of the image points adjacent to E.

The neighboring image points (relative to E) are again sorted in the stack 50 in step 75 based on the phase difference of the individual neighboring image points relative to their second surrounding region. Given the closest neighbors in the two-dimensional case, this means that four image points are organized in the stack in step 75; in the three-dimensional case, these are six image points. After the sorting of the image processing system in the stack 50, that phase difference of the image point relative to an average value of the phase values from the first environment is now calculated for the image point for which the neighbors were previously selected (namely for E).

For example, 7×7 image points in the two-dimensional case or 7×7×7 image points in the three-dimensional case can be used for this calculation. Again, only the already-checked image points are used. In the present cases, these are still the two pixels A and E (step 76). This calculated phase difference is examined in step 77, meaning that it is established whether it is smaller than 90°. If it is greater than 90°, the phase value of the examined image point is again corrected by 180° in step 78. In the event that the phase difference is smaller than 90°, the phase value is left unchanged. In step 79, the checked image point is finally marked as checked, meaning that the image point is marked with "C" in order to signal that the phase was already checked at this image point.

In step 76, the phase difference of the selected image point is calculated relative to the already-marked image points from the first environment. This difference establishment serves as a basis for the phase correction in steps 77 and 78. In step 74, the phase difference was likewise calculated relative to an average value of the phase values of neighboring image points. This phase difference establishment for each neighboring image point served for organization of the image points in the stack. The stack controls the progression of the phase correction. According to one aspect of the invention, phase values at which the determined phase value corresponds relatively well to the predetermined value 0° or 180° are considered first. If the phase value (i.e., the phase difference relative to image points in the environment) lies in proximity to 90°, the calculation is shifted to a later point in time. The correction method is more stable due to the fact that only already-checked and phase-corrected image points are taken into account in the averaging.

After the marking of the image point as phase-corrected or, respectively, checked in step 79, in step 80, it is checked whether the stack (i.e., all stack ranges 51) are empty, that is, whether all image points have been checked. If this is not the case, the method reverts to step 72, in which the next image point in the same stack range or from the next stack range is selected when the previous stack range is empty.

The selection of the nearest neighbors relative to the presently selected image point, the establishment of the phase difference of the nearest neighbors relative to their second environment, the sorting of the nearest neighbors into a stack using the phase difference, and the calculation of the phase difference for the image point that has been selected as a next stack subsequently follow again. In the first pass, only two image points from the surrounding image points have already been checked. In this next pass, the number of the checked neighboring image points that can be taken into account for the summation and averaging of the neighboring image points increases to three. In this manner the number of checked image points rises in each pass, and also the possible number of image points that lie in the surroundings and can be used for the averaging. How many image points precisely can be used from the surroundings depends on, among other things, the trajectory that results via the selection of the next image point from the stack 50. If all image points are checked in a last step, the stack 50 is emptied and the method ends in step 81.

After the end of the step 81, the phase influence (for example, due to the fatty tissue) is now corrected; the remaining phase influence represents the phase inhomogeneity that results due to system imprecisions. These phase errors can now be identified and the phase errors can be removed in imaging methods. In the event that the MR data were detected with a plurality of acquisition coils, the individual complex MR images can first be merged into a complex total image under consideration of the phase of the individual coils.

Furthermore, the sensitivity of each coil can hereby be taken into account. The sensitivity of each coil can, for example, be calculated via an auto-correlation method in which the eigenvector is calculated for the largest eigenvalue. The values of the eigenvectors respectively yield the sensitivity. This can be determined in advance. If the phase influence of each coil and the sensitivity of each coil is now determined, the total signal can be calculated via the weighting of the signals of the individual components. A signal portion with good signal reception and high signal level can hereby receive a higher weighting factor than a signal portion with very low reception level and low signal-to-noise ratio.

The use of this method, known as an adaptive combine method, improves the signal-to-noise ratio overall since the complex total image has a better signal-to-noise ratio than the individual images. This improves the phase correction workflow. Furthermore, the phase development of each coil is taken into account, which in turn makes the method more robust and reliable. A further advantage is the reduced data processing quantity, since only one image must be phase-corrected and not various images for various channels.

Figure 7:
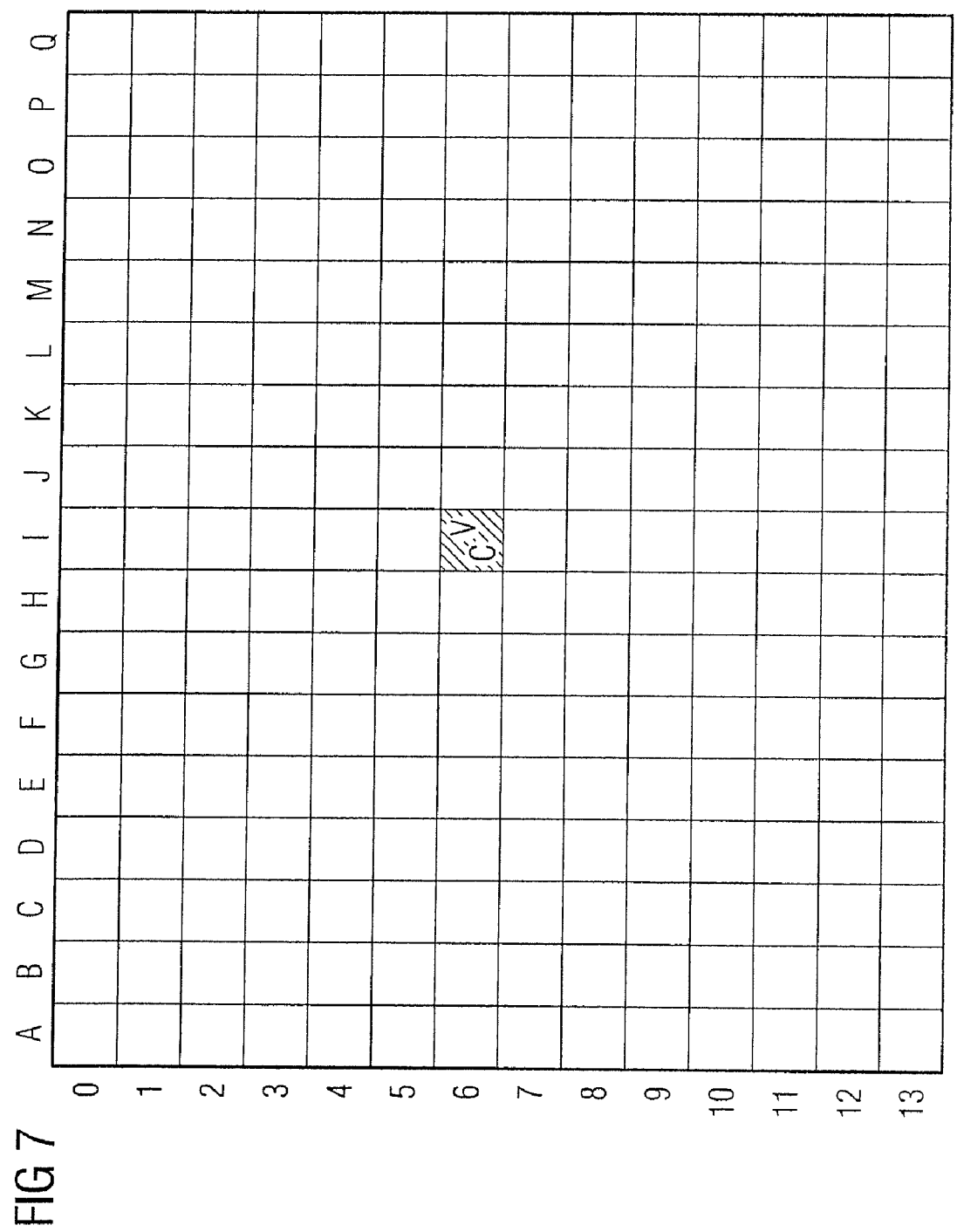
FIG. 7-19 are exemplarily pictorial representation showing a use of the individual image points in a correction method.

For better understanding of the operation, the phase correction algorithm illustrated in FIGS. 6A and 6B is explained using exemplary images in FIGS. 7-18. Shown in FIG. 7 are image points of a phase image that are designated with A-Q in the columns and from 0-13 in the rows. At the beginning, a starting image point is selected, analogous to step 62. In the illustrated case, this is the image point with the coordinates 16. This starting image point is marked as checked and visited, i.e., with "C" for checked and "v" for visited.

Figure 8:
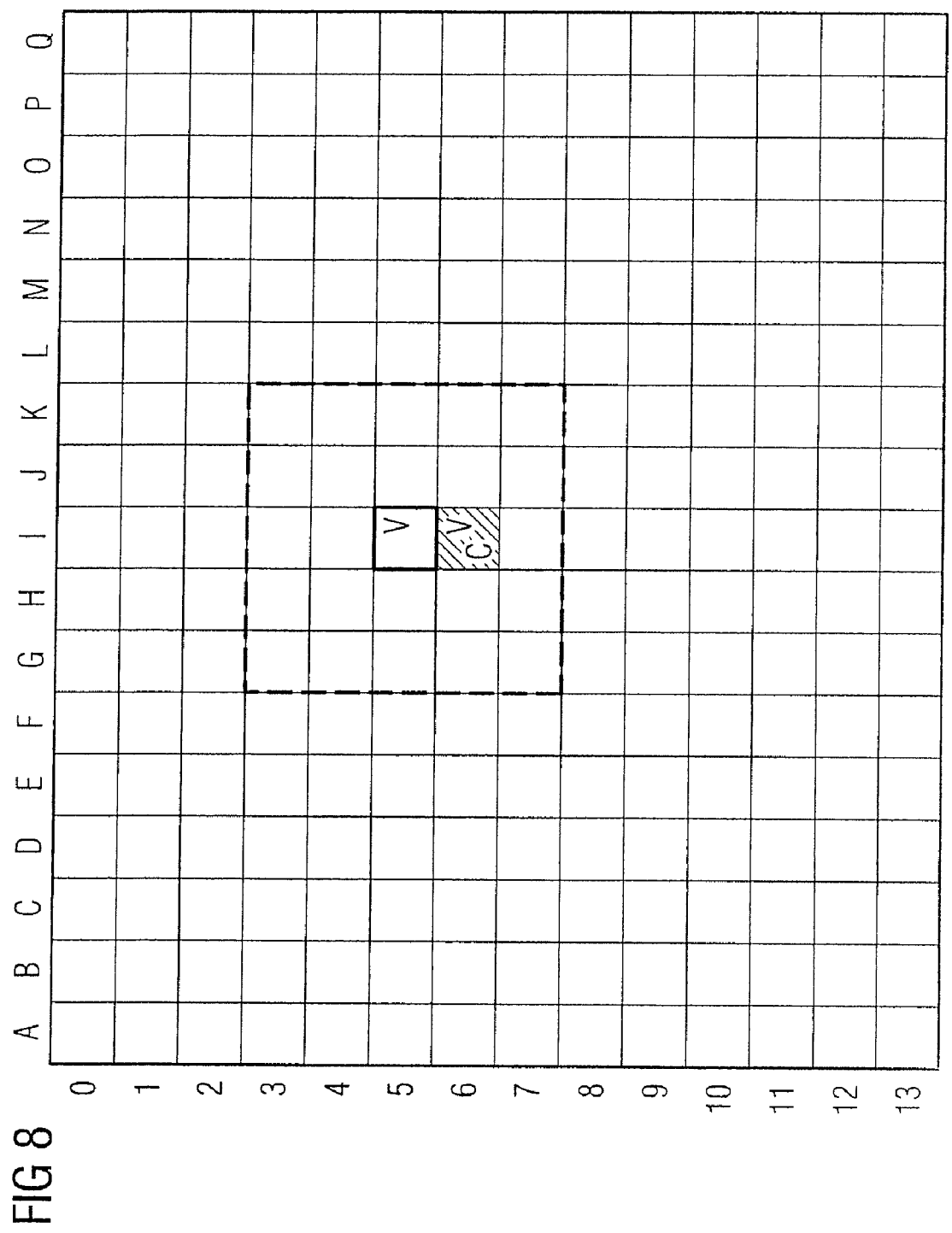

As recognized from FIG. 8, after selection of the direct neighboring image points (analogous to step 63), the neighboring image point is visited, here image point I5. An environment of 5×5 image points is subsequently marked (shown in dashed lines) for the image point I5. An averaged phase value is formed for these image points within the dashed quadrilateral, whereby only already-checked image points are considered, meaning image points that are marked with C. In this case this is only the image point I6. Image point I5 is placed in the stack on the basis of the phase difference between the averaged phase value formed from I6 and the phase value of image point I5. I5 is likewise marked as visited.

Figure 9:
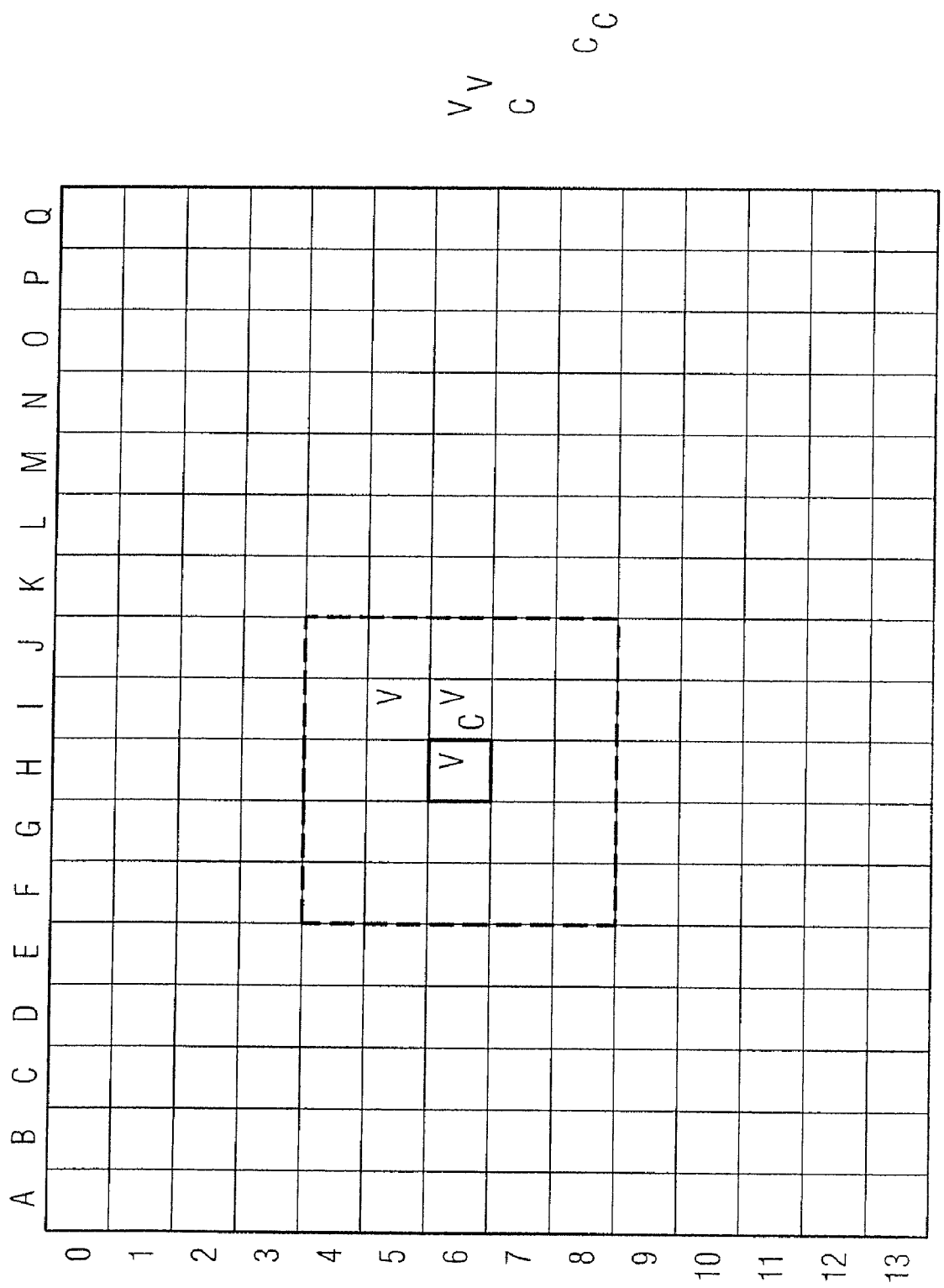
Figure 10:
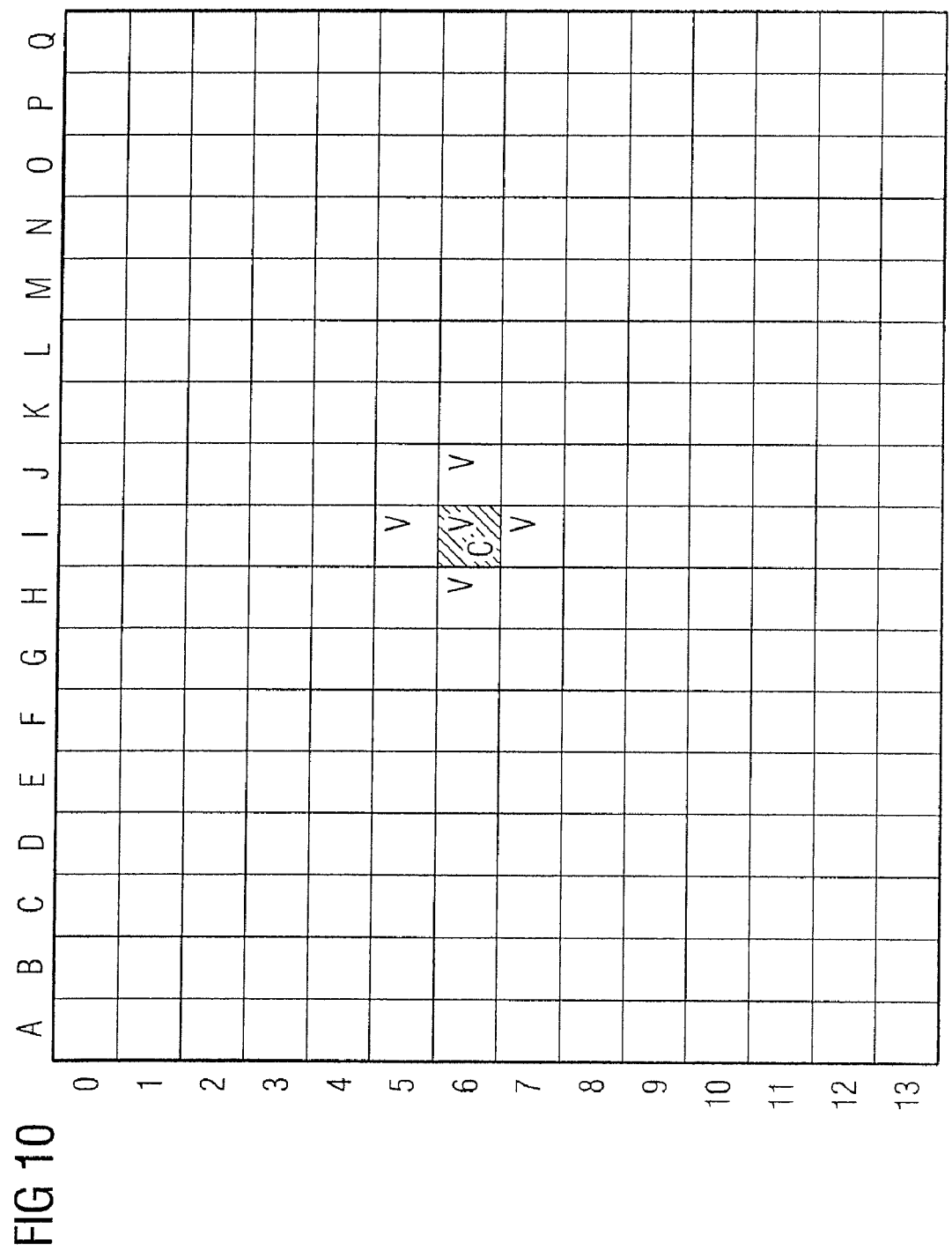

As is to be recognized in FIG. 9, if the same procedure that was implemented for image point I5 is implemented for image point H6, an averaged phase value of image points from the surroundings is calculated under consideration of image points already checked in terms of phase; this image point is placed in the stack dependent on the calculated phase difference. In FIG. 10, it is now to be recognized that all four direct neighbors of the image point I6 have been visited and have been sorted in the stack.

Figure 11:
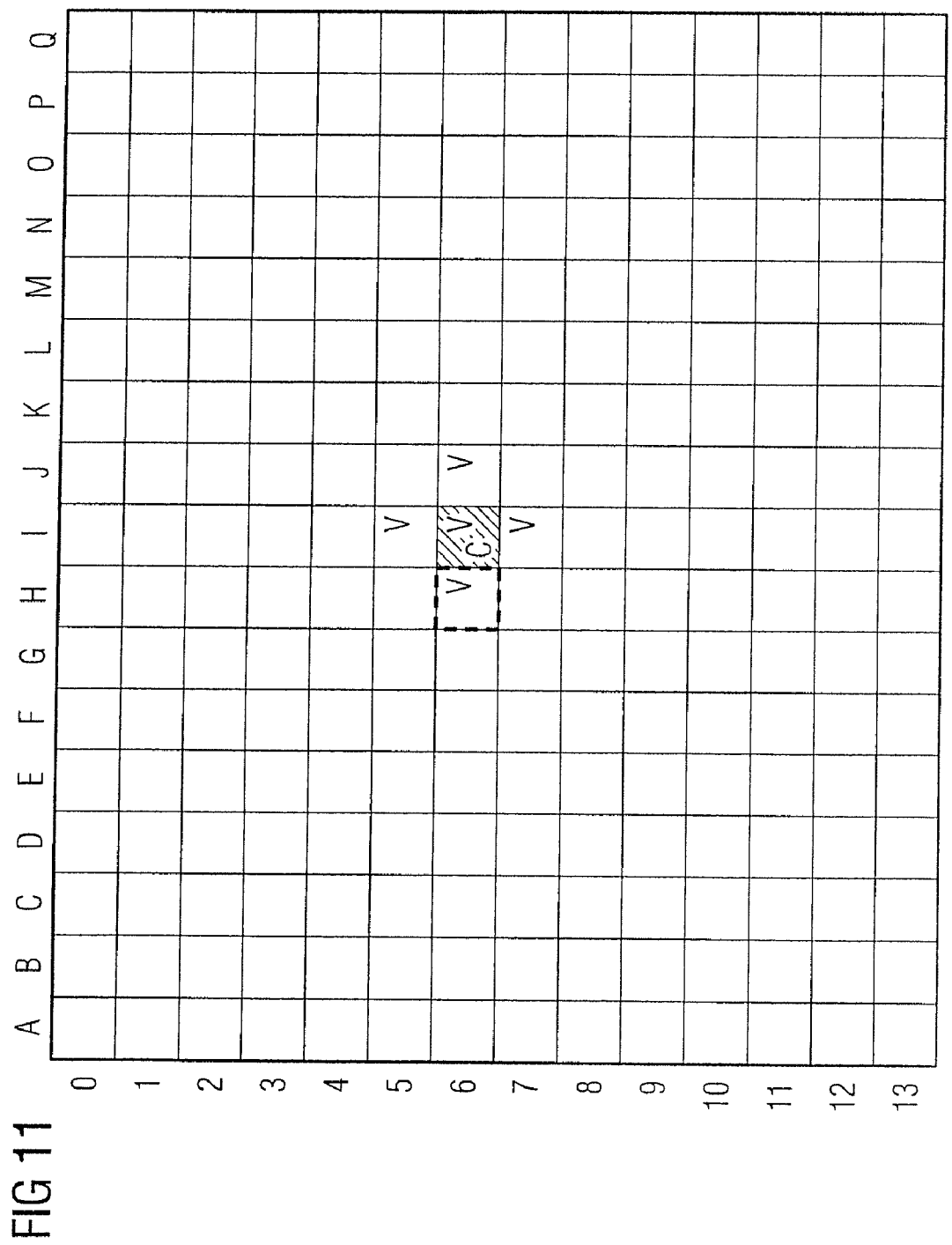
Figure 12:
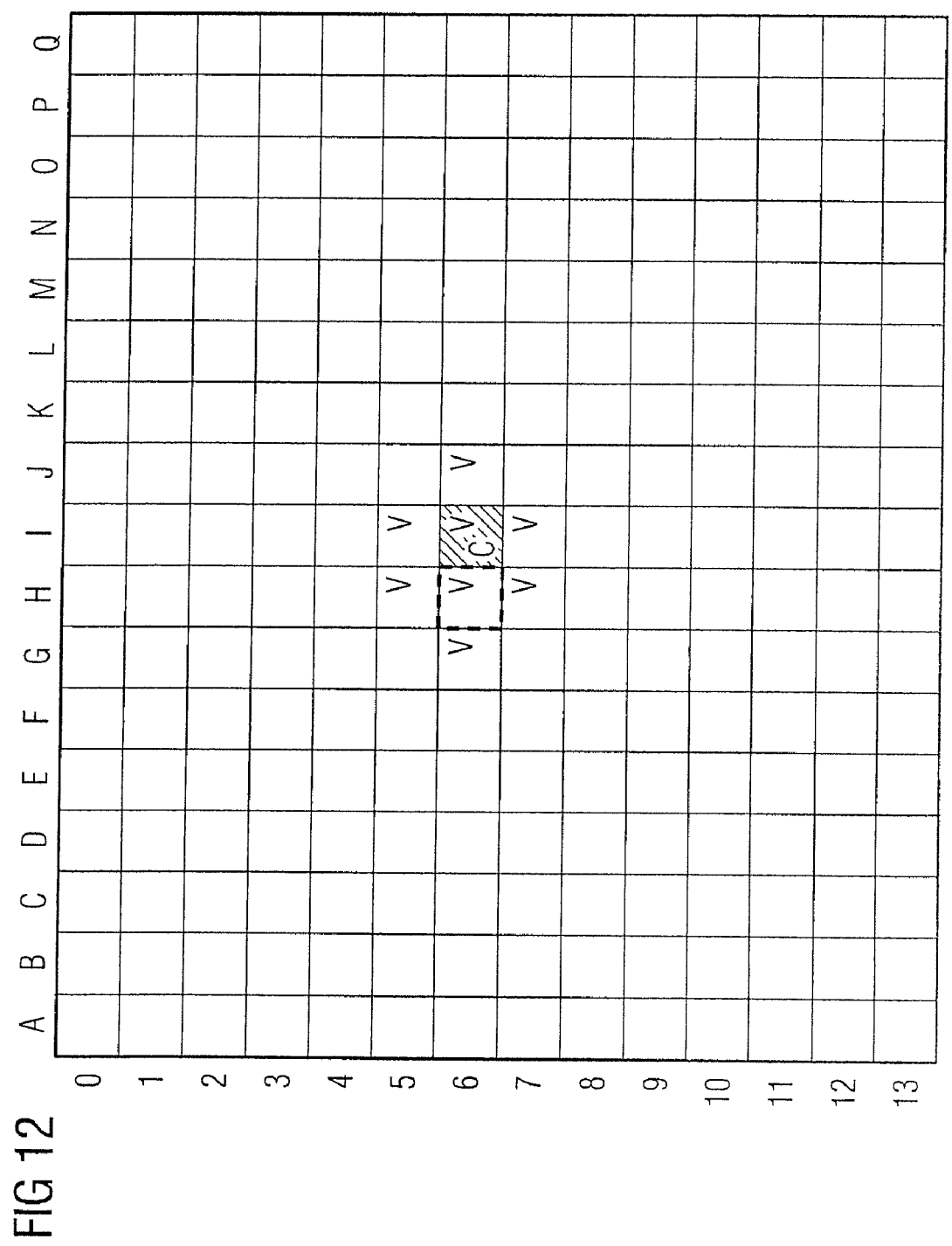
Figure 13:
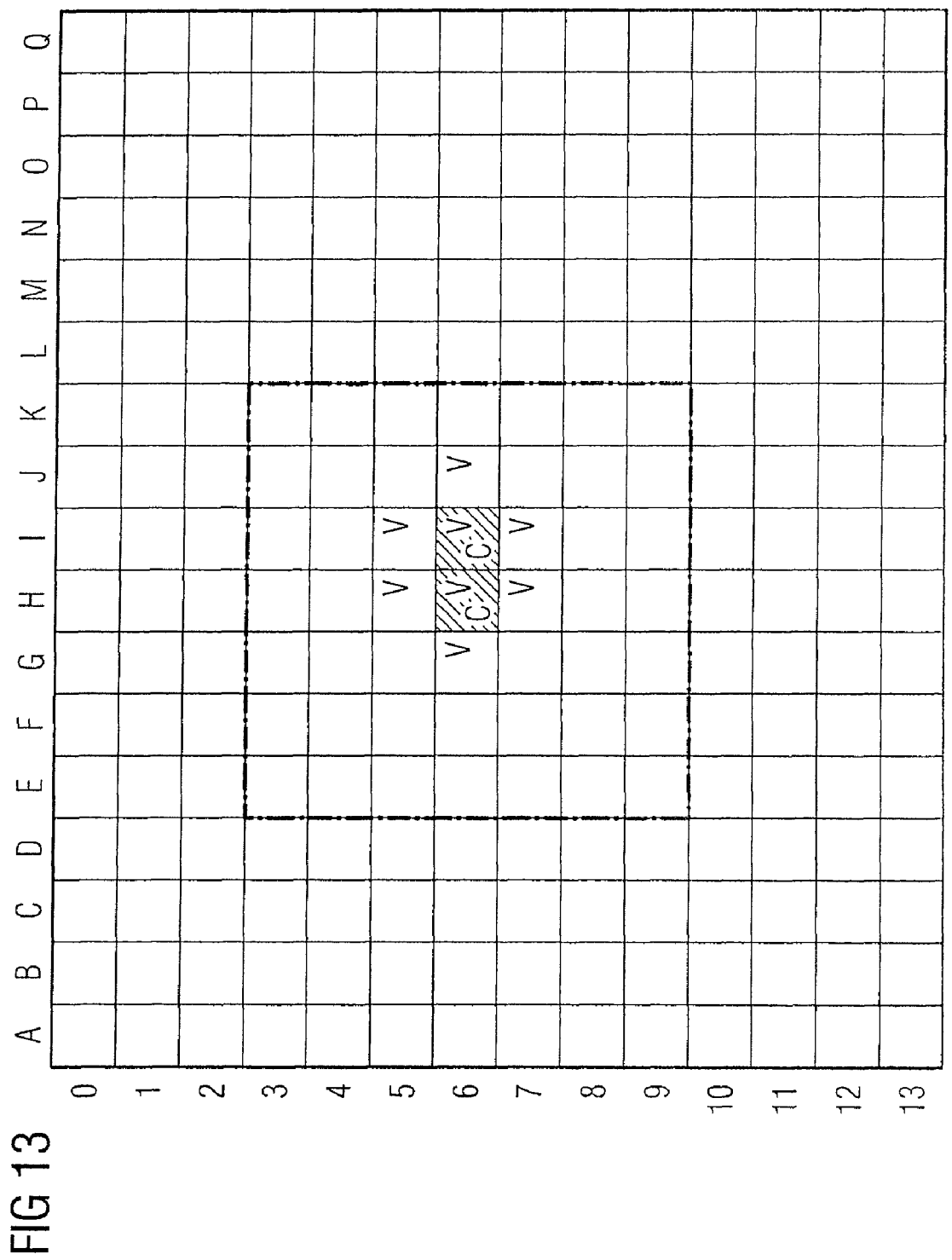
Figure 14:
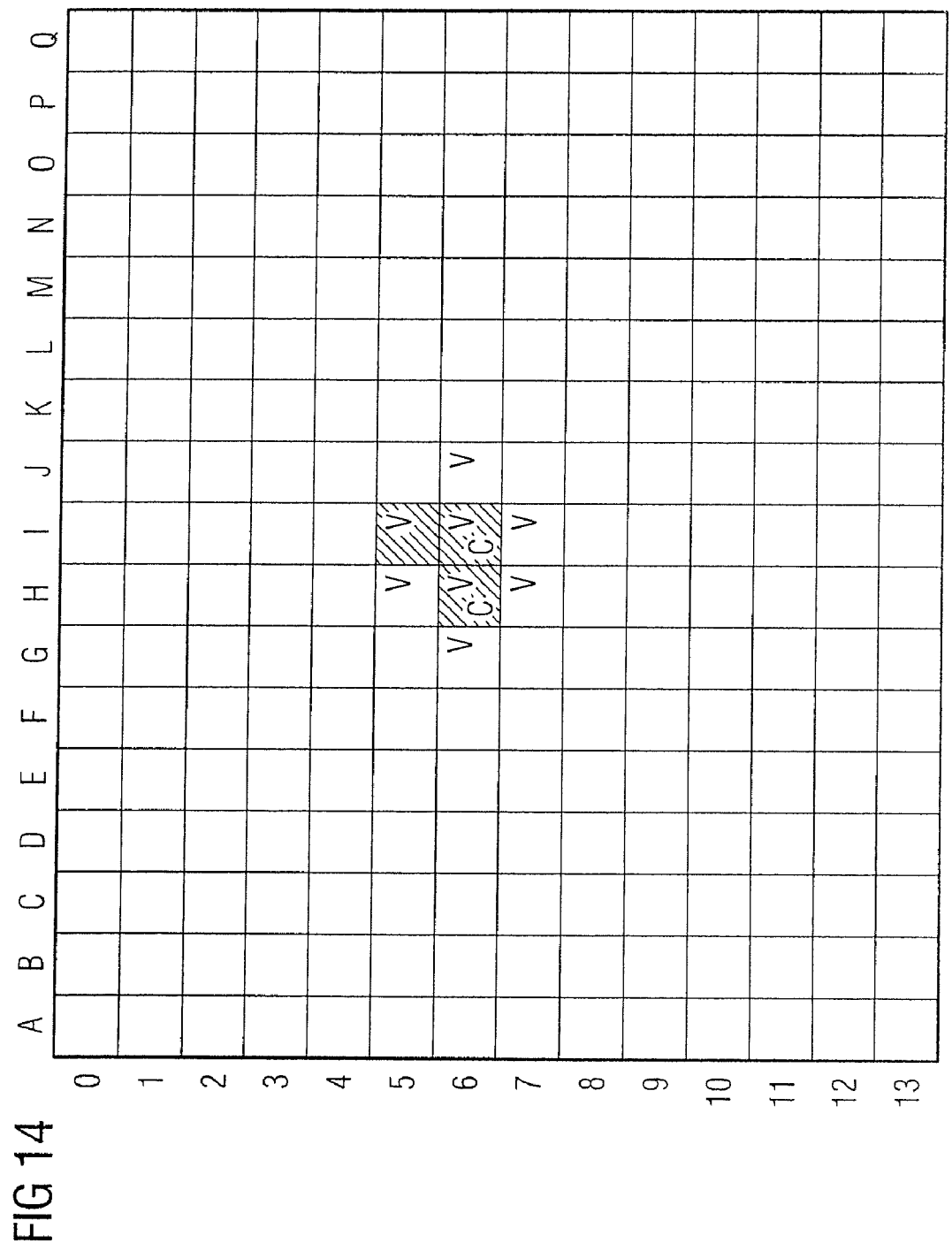
Figure 15:
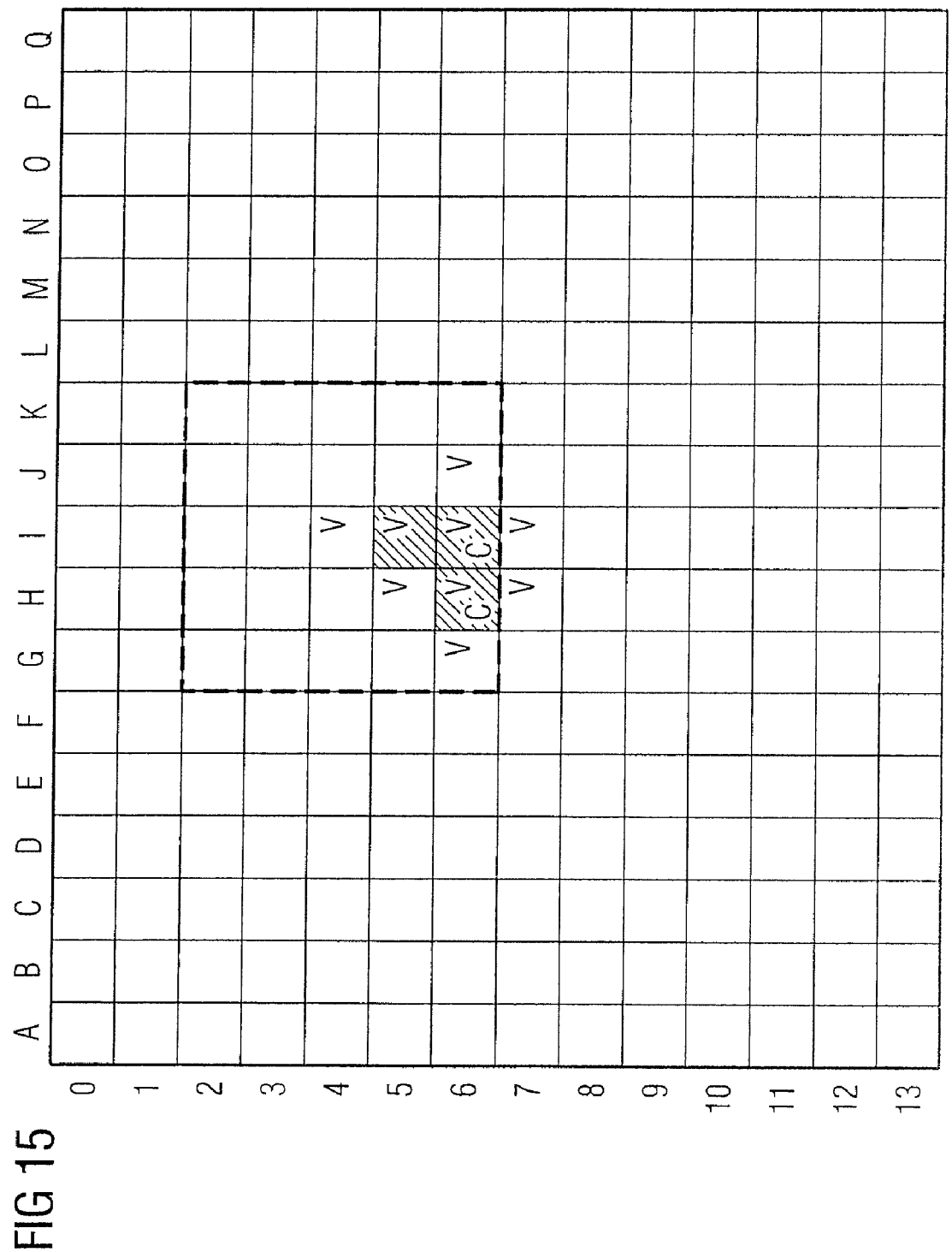

In FIG. 11, it is shown how (analogous to step 65) the image point from the stack with the least phase difference is selected. In the shown example, this is the framed image point H6. As mentioned in step 66 and shown in FIG. 12, the direct neighbors that were not yet selected are selected again, i.e., the image points G6, H5 and H7. These neighboring image points (that were newly indicated with "v") are in turn sorted into the stack, as was described in connection with FIG. 7-10. As is to be recognized in FIG. 13, a first environment (in the shown case, image points in a 7×7 environment that are shown with a dash-dot line) is now selected for the image point H6 taken from the stack.

A phase difference between the image point H6 and the adjacent image points that were already checked (this is only the image point I6) is hereby calculated (analogous to step 68). Due to the phase difference between the selected image point H6 and the averaged phase value from the surroundings, it is now checked whether the phase difference is smaller than 90° or not. The steps follow analogous to steps 69-71, whereby after the check the image point H6 is likewise marked as checked via marking with "C" for "checked".

Figure 16:
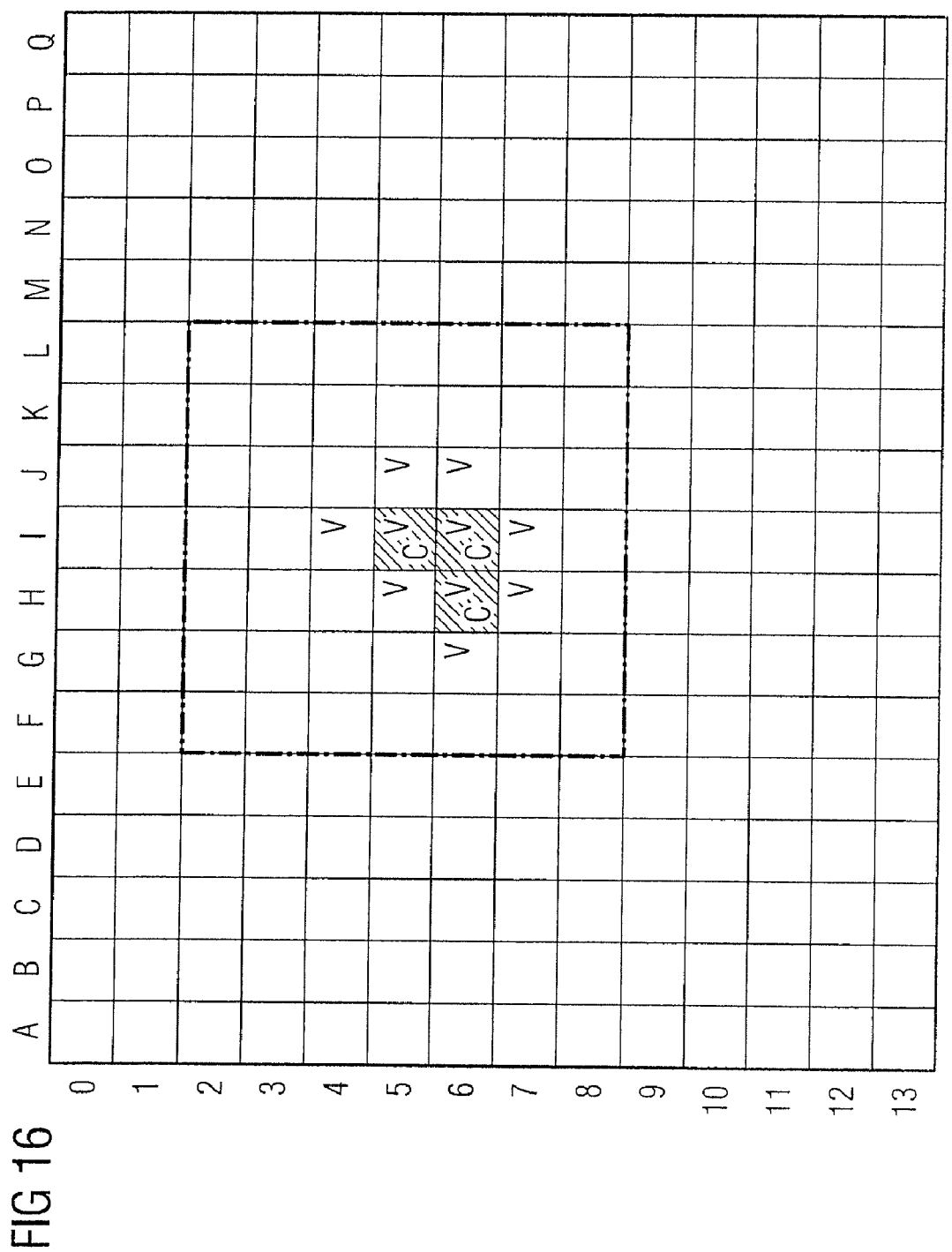

The image point H6 is subsequently removed from the stack and the next image point with the smallest phase difference (image point I5 in the example shown in FIG. 14) is taken from the stack. For image point I5, the nearest neighbors are again visited, in FIG. 15 the image point I4. The difference of the neighbors that were already checked is calculated again for this image point. Two image points (namely the image points H6 and I6) that are marked as checked are taken into account in the averaging according to FIG. 15. After all neighbors of the image point I5 have been visited, namely the image points I4, H5 and J5, the phase difference for image point I5 relative to an averaged phase difference of the surrounding image points (again selected from the dash-dot region) is calculated as shown in FIG. 16. The two image points that are marked with "C" are again taken into account in this calculation of the surrounding image points. It is subsequently checked whether the phase difference is smaller than 90° or not and, in the event that it is necessary, the phase value is corrected by 180°; the image point I5 is also subsequently marked as checked.

Figure 17:
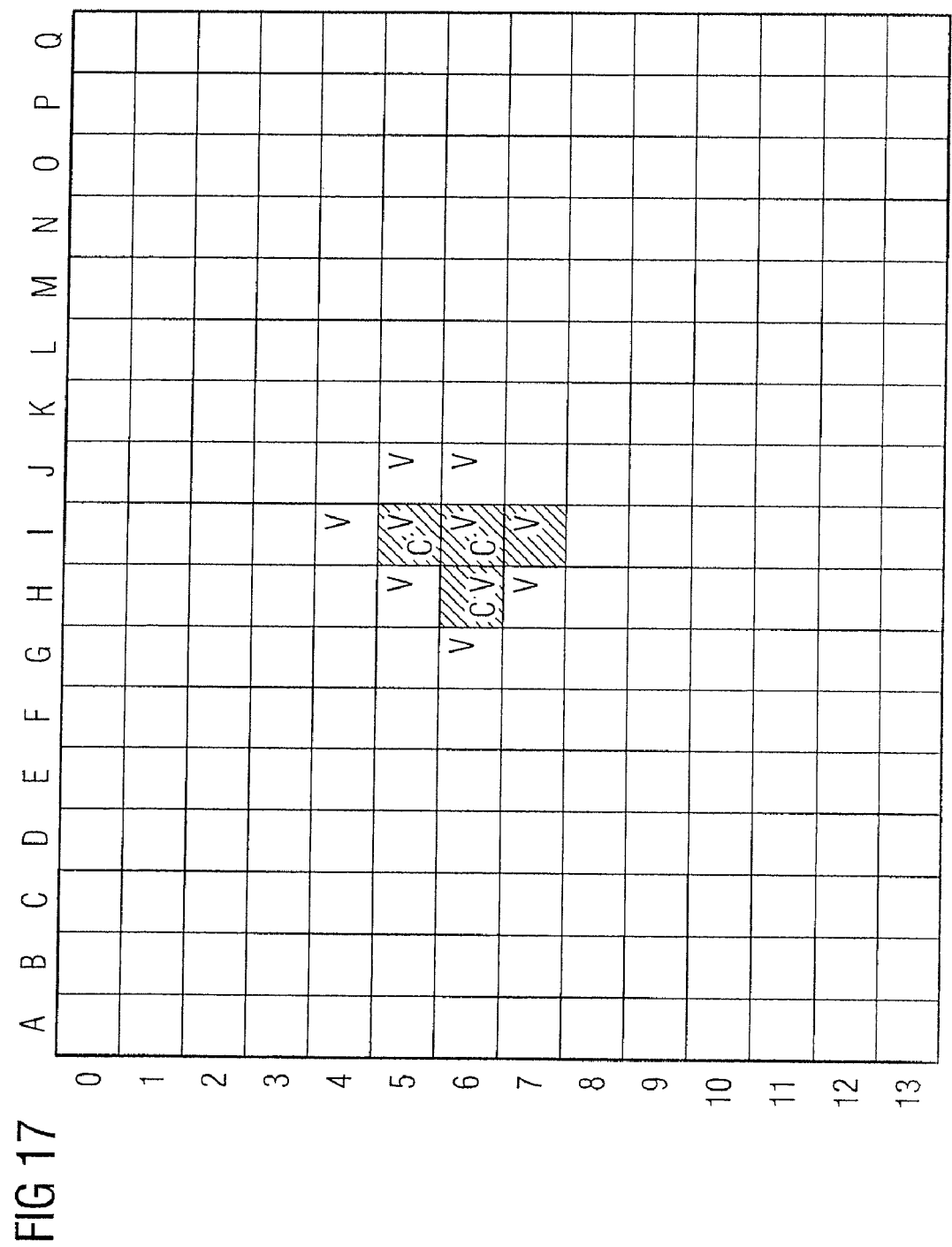
Figure 18:
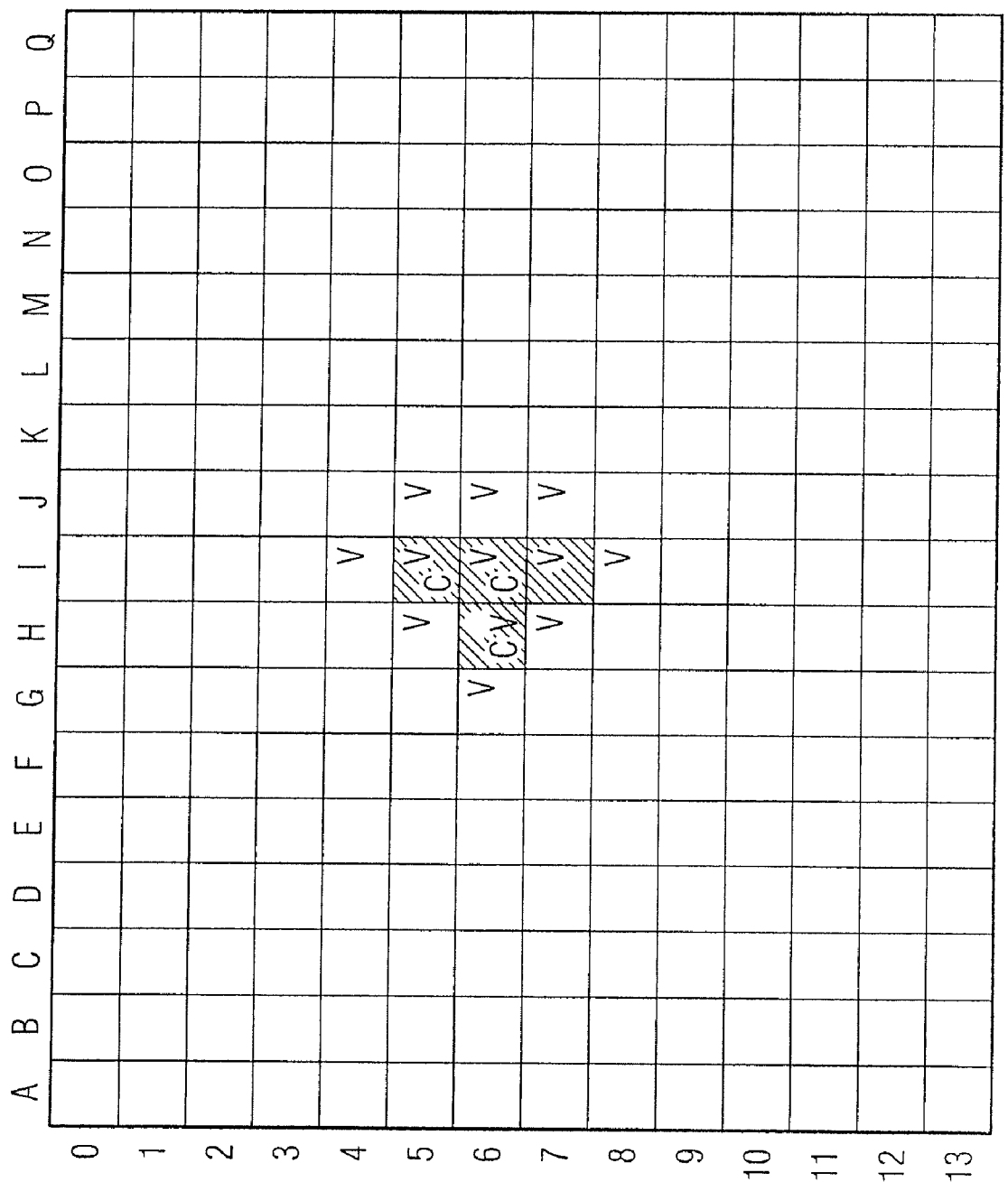
Figure 19:
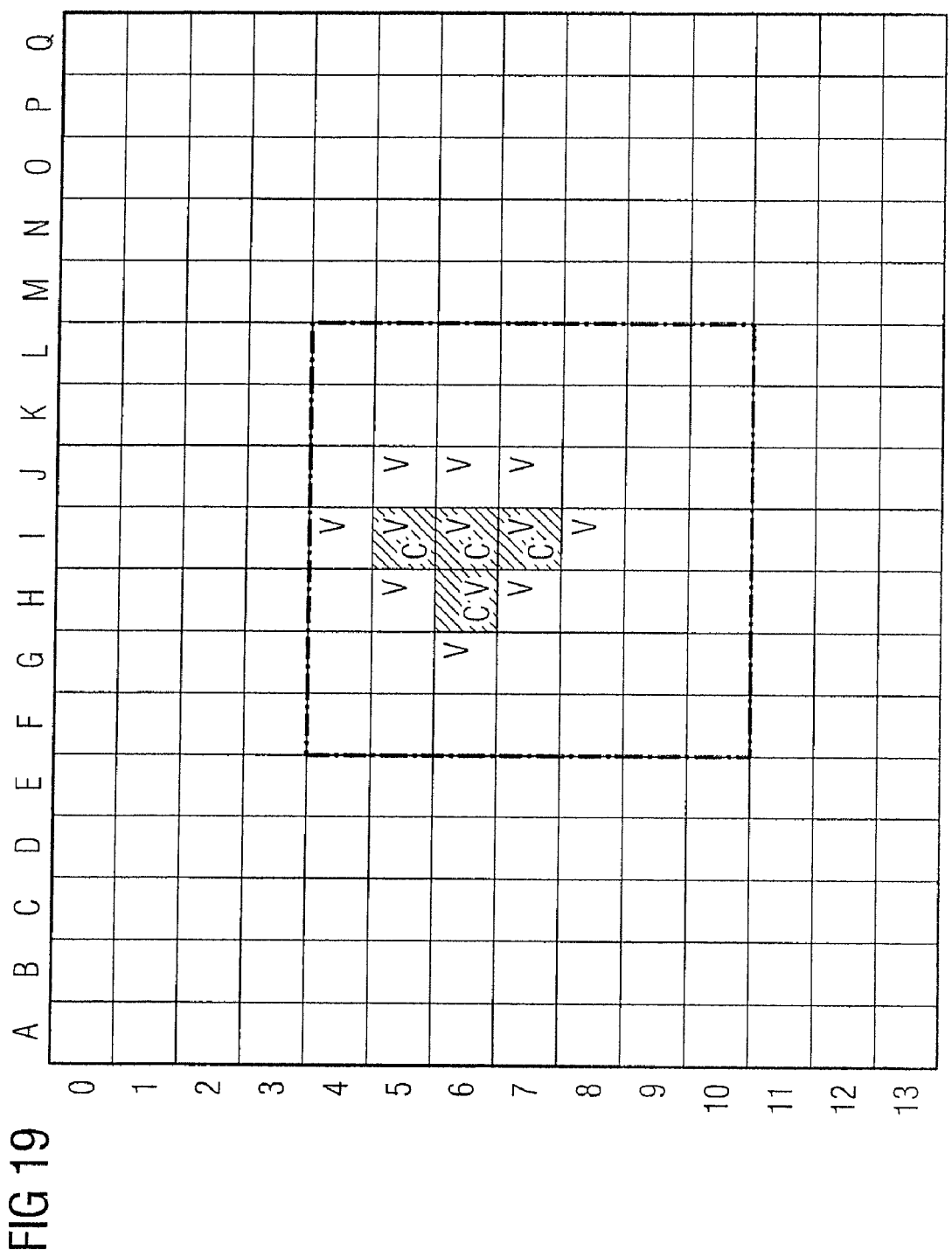

It is again to be recognized in FIG. 17 that image point I7 is used as a next image point from the stack, whereby in FIG. 18, the nearest neighbors that were not yet visited are again selected, i.e., the image points H7, I8 and J7. After averaging for these individual neighboring image points with their respective surroundings, as shown in FIG. 19, an environment of 7×7 pixels is again selected for the previously selected image point (here image point I7) and a phase difference of this image point with the averaged phase value of the adjacent image points that are already corrected is calculated, in the present case under consideration of three image points.

As can be learned in FIG. 6B, this correction algorithm runs in a loop, whereby the number of already-checked image points is small at the beginning of the correction and then grows slowly. Quadratic surroundings are used as neighboring image points in FIGS. 7-19; however, other surrounding regions and shapes (such as circles etc.) can also be used. As is again clear from FIGS. 7-19, only image points that were already checked (i.e., at which the phase value was corrected by 180° in the event that this was necessary) are considered in the averaging in the surroundings. In the method described here, the sorting of the image points (when they are considered) ensues as part of the region growing method, since here only checked image points are taken into account.

Figure 20:
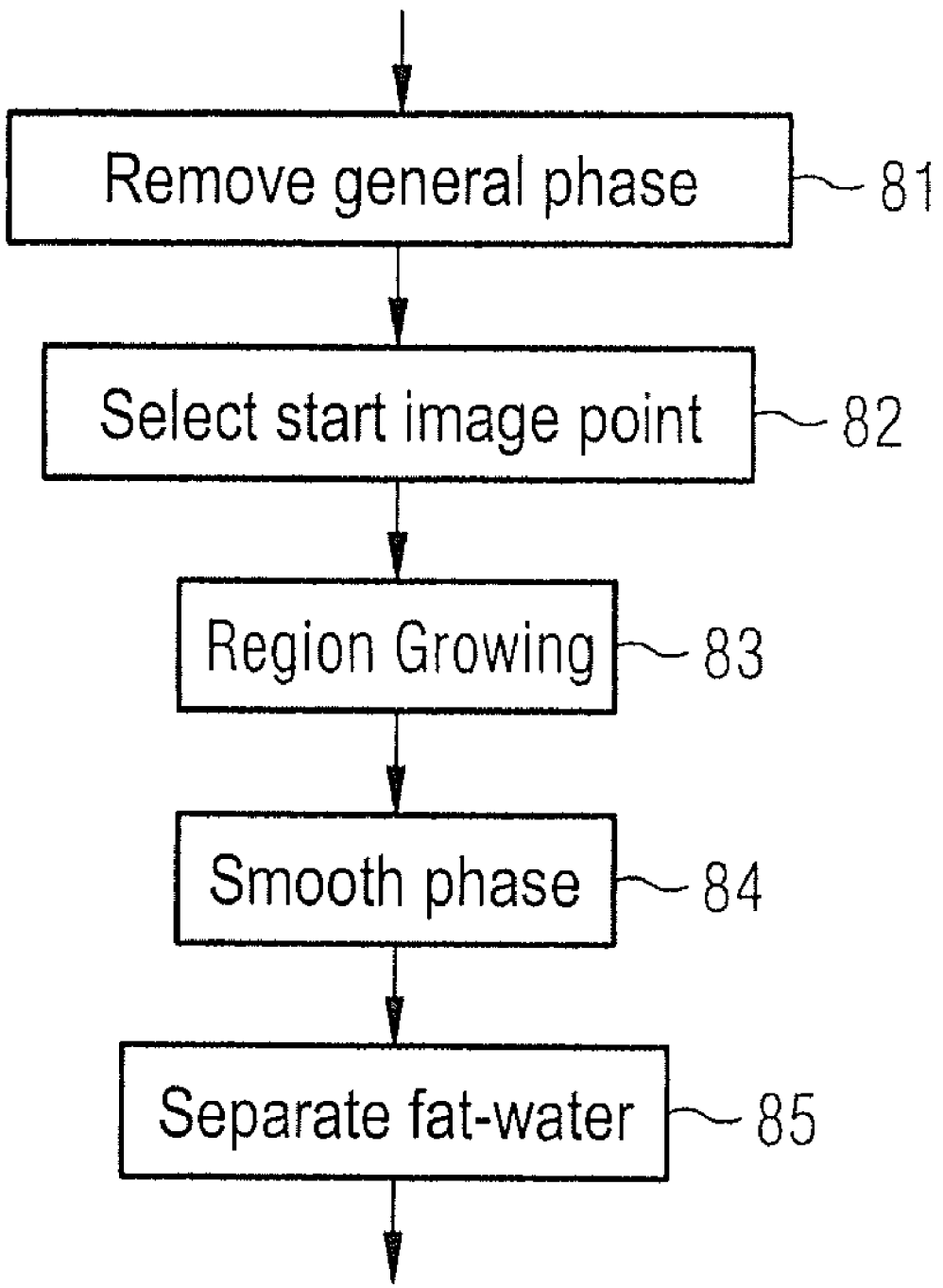
FIG. 20 is a flow chart of a further application case for the phase correction method of an embodiment of the invention.

A further application case of the method is shown in FIG. 20. After the acquisition of the MR images and the removal of the general phase $\phi 0$ in step 81, a start image point can be selected in step 82 and the region growing algorithm described in connection with FIG. 6 is executed in step 83. After smoothing of a phase in step 84, the image points with signal portion "fat" can now be separated from the image points with signal portion "water" in step 85.

In summary, the present invention enables a reliably functioning method for correction of a phase error that can be used in many different applications N in which the calculation with correct phase values or, respectively, the removal of phase errors is of importance.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like. The word mechanism is used broadly and is not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A method for correcting a phase error in an MR image, comprising:
   acquiring MR signals of an examination subject;
   generating complex images of the examination subject from the acquired MR signals;
   establishing phase differences of phase values for various image points of the complex images with, respectively, an averaged phase value of image points from a first surrounding region of a respective image point;
   executing a phase correction dependent on how well the phase differences correspond to a predetermined phase value, an order of the image points in which the phase correction is implemented depends on how well the phase values in the image points correspond to the predetermined phase value; and
   providing a user readable or machine readable output related to the phase correction.

2. The method according to claim 1, further comprising:
   utilizing essentially only image points at which it as been checked how well phase differences correspond to the predetermined phase value for the calculation of the averaged phase value from the first surrounding region.

3. The method according to claim 1, further comprising:
   checking whether a formed phase difference of an image points lies within a predetermined angular range with an averaged phase value from the first surrounding region; and
   if yes, then leaving the phase value of the checked image point unchanged; and
   if no, correcting the phase value of the checked image point by a predetermined phase value.

4. The method according to claim 1, wherein an order of the establishment of the phase difference for the various image points ensues dependent on how well phase differences of the individual image points corresponding to the predetermined phase value, the method further comprising:
   taking into account the corresponding image point with the phase value in the phase correction in proportion to a degree of correspondence of the phase difference of an image point to the predetermined phase value.

5. The method according to claim 3, wherein the predetermined angular range includes angles between 0° and 90°, the phase value being left unchanged if the phase difference is smaller than 90°, while the phase value of an image point is corrected by 180° when the phase difference is greater than 90°.

6. The method according to claim 1, further comprising:
   determining neighboring image points relative to image points for which the phase difference should be established;
   determining, for the neighboring image points, further phase differences of the neighboring image points relative to an averaged phase value of image points from a second surrounding region relative to the respective neighboring image points;
   sorting the further phase difference of the neighboring image points according to magnitude; and
   selecting from the neighboring image points of a next image point for which the phase correction is implemented, dependent on the further phase difference.

7. The method according to claim 6, further comprising:
   sorting the further phase differences of the neighboring image points into stack ranges in which image points with phase values from a predetermined phase range are situated; and
   processing stack ranges with low phase ranges before stack ranges with higher phase ranges.

8. The method according to claim 1, wherein the examination subject comprises signal portions of at least two tissue types, the method further comprising:
   identifying and separating the at least two different tissue types.

9. The method according to claim 8, wherein the two tissues have a different chemical shift and thus different resolution frequency, the method further comprising:
   in the acquisition of the MR signals, acquiring signals in which a phase position of the two tissues is essentially identical in one case, and in an other case acquiring signals in which phase positions of the two tissues are aligned opposite to one another.

10. The method according to claim 8, further comprising:
utilizing two predetermined phase values that correspond to 0° and 180° as predetermined phase values; and
checking whether the determined phase differences correspond to 0° or 180°.

11. The method according to claim 9, further comprising:
determining which tissue type is responsible for a resulting phase value in an image point based on the MR signals in which the phase positions of the two tissue types are opposite; and
correcting the phase value of an image point by 180° or not depending on the determined tissue type.

12. The method according to claim 11, further comprising:
producing a resultant phase curve that corresponds to system-dependent phase error of the MR system in the phase values of the complex MR signal after the identification of the two tissue types and the correction of the phase difference by 180° for one of the tissue types.

13. The method according to claim 8, wherein the two different tissue types are fat and water.

14. The method according to claim 1, wherein adjacent image points from three different spatial directions are used for the averaged phase value.

15. The method according to claim 1, wherein between three and nine image points in each spatial direction are used for the averaged phase values.

16. The method according to claim 15, wherein between six and eight image points in each spatial direction are used for the averaged phase values.

17. The method according to claim 15, wherein between five and seven image points in each spatial direction are used for the averaged phase values.

18. The method according to claim 1, further comprising:
utilizing a plurality of acquisition coils for the acquisition of the MR signals;
combining the complex MR signals of the individual coils into a complex total signal before a phase correction is implemented on the complex total signal.

19. The method according to claim 18, further comprising:
determining phase information of each acquisition coil; and
taking this phase information taken into account in calculating the complex total signal.

20. The method according to claim 18, further comprising:
assessing a sensitivity of each acquisition coil before the formation of the complex total signal; and
in the formation of the total signal, weighting a portion of the signal of each coil dependent on its sensitivity.

21. The method according to claim 6, further comprising:
taking into account essentially only image points in which it has been checked how well the phase differences correspond to the predetermined phase value in the determining of the averaged phase values of image points from the second surrounding region.

22. A method for phase error correction in a magnetic resonance (MR) image, comprising:
acquiring MR signals from an examination subject;
through a processor, generating a complex image of the examination subject from the acquired signals, said complex image comprising a plurality of image points each having a phase value;
in said processor, automatically determining which image points, among said plurality of image points, are in need of phase correction by, for each image point under consideration for phase correction, forming an average of respective phase values of image points within a predetermined region surrounding the image point under consideration for phase correction, forming a difference between the phase value of image point under consideration for phase correction and said average, comparing said difference to a predetermined difference value to obtain a difference comparison and, for at least some image points under consideration for phase correction that have a non-zero difference comparison, correcting the respective phases thereof in an order dependent on said difference comparison;
in said processor, generating a corrected complex image by replacing the phase for said at least some image points with a corrected phase; and
making said corrected complex image available at an output of the processor as a data file in a form convertible into a humanly perceptible image of the examination subject.

23. A method as claimed in claim 22 comprising acquiring said MR signals from said examination subject containing fat and water, and generating said complex image with fat-dominated image points produced from MR signals originating primarily from fat in the examination subject, and water-dominated image points produced from MR signals originating primarily from water in the examination subject, and using, as said predetermined difference value, a predetermined difference value that differentiates said fat-dominated image points from said water-dominated image points.

24. A method as claimed in claim 21 comprising defining said some of said image points as image points for which said non-zero difference comparison exceeds a predetermined difference comparison value.

* * * * *